United States Patent
Ito et al.

(10) Patent No.: US 10,141,525 B2
(45) Date of Patent: Nov. 27, 2018

(54) LIGHT-EMITTING DEVICE, MODULE, AND ELECTRONIC DEVICE

(71) Applicant: Semiconductor Energy Laboratory Co., Ltd., Atsugi-shi, Kanagawa-ken (JP)

(72) Inventors: Minato Ito, Tokyo (JP); Kohei Yokoyama, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/746,925

(22) Filed: Jun. 23, 2015

(65) Prior Publication Data

US 2015/0380673 A1    Dec. 31, 2015

(30) Foreign Application Priority Data

Jun. 30, 2014  (JP) ................. 2014-133819

(51) Int. Cl.
*H01L 51/52* (2006.01)
*H01L 51/00* (2006.01)
*H01L 27/32* (2006.01)

(52) U.S. Cl.
CPC ...... *H01L 51/0097* (2013.01); *H01L 27/3244* (2013.01); *H01L 51/524* (2013.01); *H01L 27/322* (2013.01); *H01L 2251/5307* (2013.01); *H01L 2251/5315* (2013.01); *H01L 2251/5338* (2013.01); *H01L 2251/558* (2013.01); *Y02E 10/549* (2013.01)

(58) Field of Classification Search
CPC ............ H01L 51/0097; H01L 27/3244; H01L 51/524; H01L 2251/5315; H01L 27/322; H01L 2251/5338; H01L 2251/558; H01L 2251/5307; Y02E 10/549
See application file for complete search history.

(56) References Cited

U.S. PATENT DOCUMENTS

| | | |
|---|---|---|
| 7,129,102 B2 | 10/2006 | Yamazaki |
| 7,132,317 B2 | 11/2006 | Arao |
| 7,351,300 B2 | 4/2008 | Takayama et al. |
| 7,811,911 B2 | 10/2010 | Shimomura et al. |
| 7,825,002 B2 | 11/2010 | Takayama et al. |
| 7,915,684 B2 | 3/2011 | Tanada |
| 8,017,508 B2 | 9/2011 | Shimomura et al. |

(Continued)

FOREIGN PATENT DOCUMENTS

JP    2003-174153 A    6/2003

*Primary Examiner* — Latanya N Crawford
(74) *Attorney, Agent, or Firm* — Fish & Richardson P.C.

(57) ABSTRACT

A device in which warpage or distortion is less likely to occur even in a high-temperature or high-humidity environment is provided. A light-emitting device includes a first flexible substrate, a second flexible substrate, and an element layer. The first flexible substrate includes an organic resin. The second flexible substrate includes an organic resin. The element layer is positioned between the first flexible substrate and the second flexible substrate. The element layer includes a light-emitting element. The light-emitting element emits light to the first flexible substrate side. The first flexible substrate has higher average transmittance of light having a wavelength of greater than or equal to 400 nm and less than or equal to 800 nm than the second flexible substrate.

28 Claims, 11 Drawing Sheets

(56) References Cited

U.S. PATENT DOCUMENTS

| | | |
|---|---|---|
| 8,034,724 B2 | 10/2011 | Shimomura et al. |
| 8,242,002 B2 | 8/2012 | Shimomura et al. |
| 8,324,077 B2 | 12/2012 | Tanada |
| 8,338,198 B2 | 12/2012 | Takayama et al. |
| 8,367,440 B2 | 2/2013 | Takayama et al. |
| 8,415,208 B2 | 4/2013 | Takayama et al. |
| 8,415,228 B2 | 4/2013 | Hanaoka et al. |
| 8,674,364 B2 | 3/2014 | Takayama et al. |
| 9,331,310 B2 * | 5/2016 | Chida ................. H01L 51/5237 |
| 2001/0040645 A1 * | 11/2001 | Yamazaki ......... G02F 1/133305 349/42 |
| 2005/0040762 A1 * | 2/2005 | Kurihara ............. H01L 51/5246 313/512 |
| 2007/0065995 A1 | 3/2007 | Arao |
| 2007/0278493 A1 * | 12/2007 | Sato ....................... H05B 33/22 257/72 |
| 2009/0047859 A1 * | 2/2009 | Kim .................. G02F 1/133305 445/24 |
| 2012/0001534 A1 * | 1/2012 | Kim .................... H01L 51/5253 313/317 |
| 2013/0126973 A1 | 5/2013 | Arao |
| 2013/0214324 A1 | 8/2013 | Takayama et al. |
| 2013/0240855 A1 * | 9/2013 | Chida ................. H01L 51/5237 257/40 |
| 2013/0299789 A1 | 11/2013 | Yamazaki et al. |
| 2014/0232962 A1 * | 8/2014 | Ishida ................... H01L 25/167 349/42 |
| 2014/0264351 A1 | 9/2014 | Takayama et al. |
| 2015/0035001 A1 | 2/2015 | Yamazaki et al. |
| 2015/0280130 A1 * | 10/2015 | Sago ................... H01L 51/0005 257/99 |
| 2015/0351168 A1 | 12/2015 | Yasumoto et al. |
| 2015/0357572 A1 * | 12/2015 | Osaki ................. H01L 51/0024 438/26 |
| 2016/0240822 A1 * | 8/2016 | Chida ................. H01L 51/5237 |

* cited by examiner

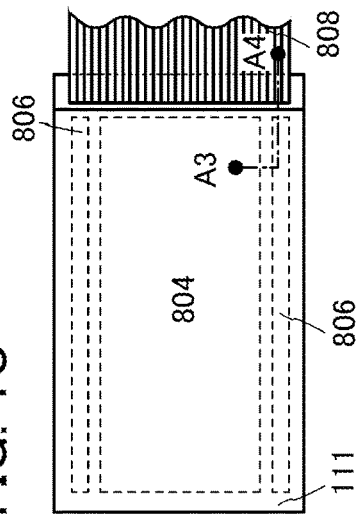
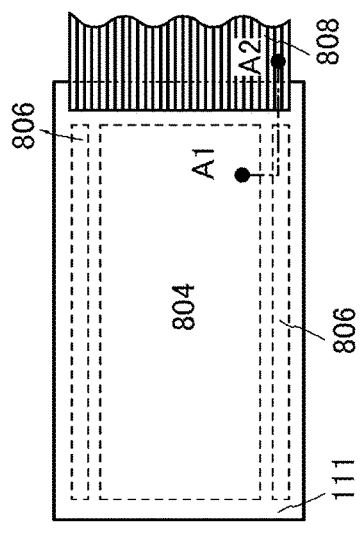
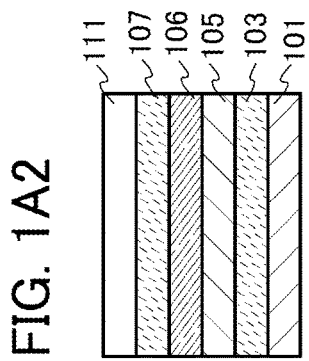
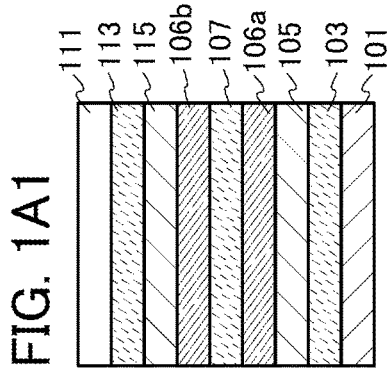
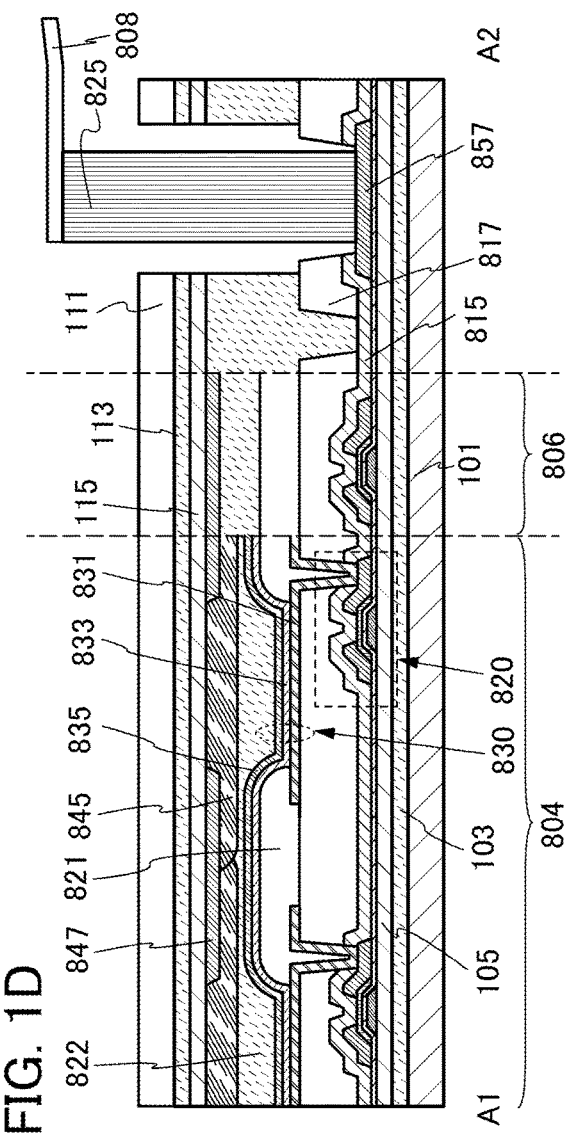

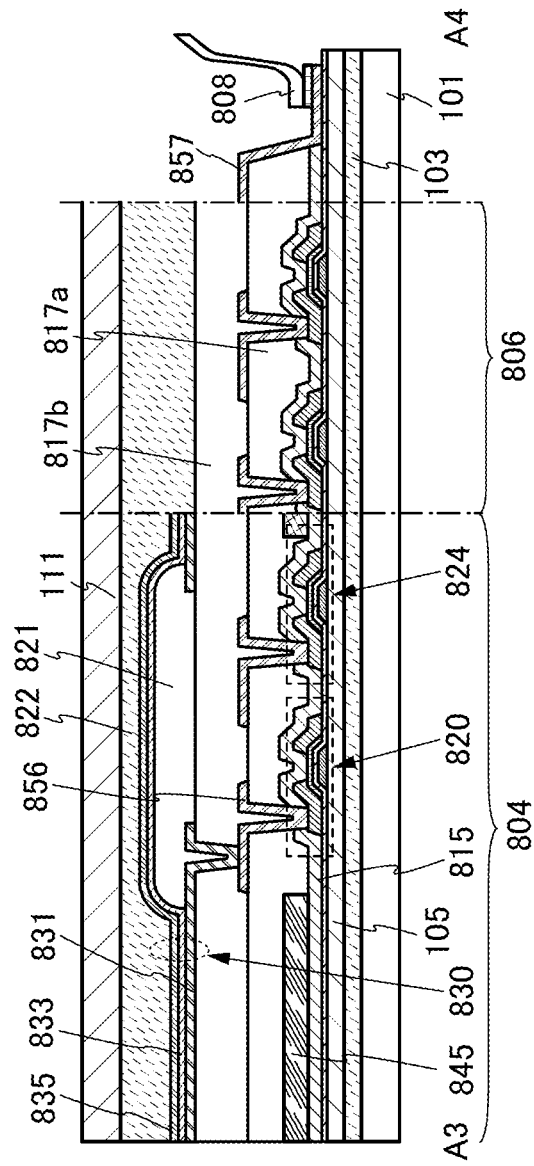

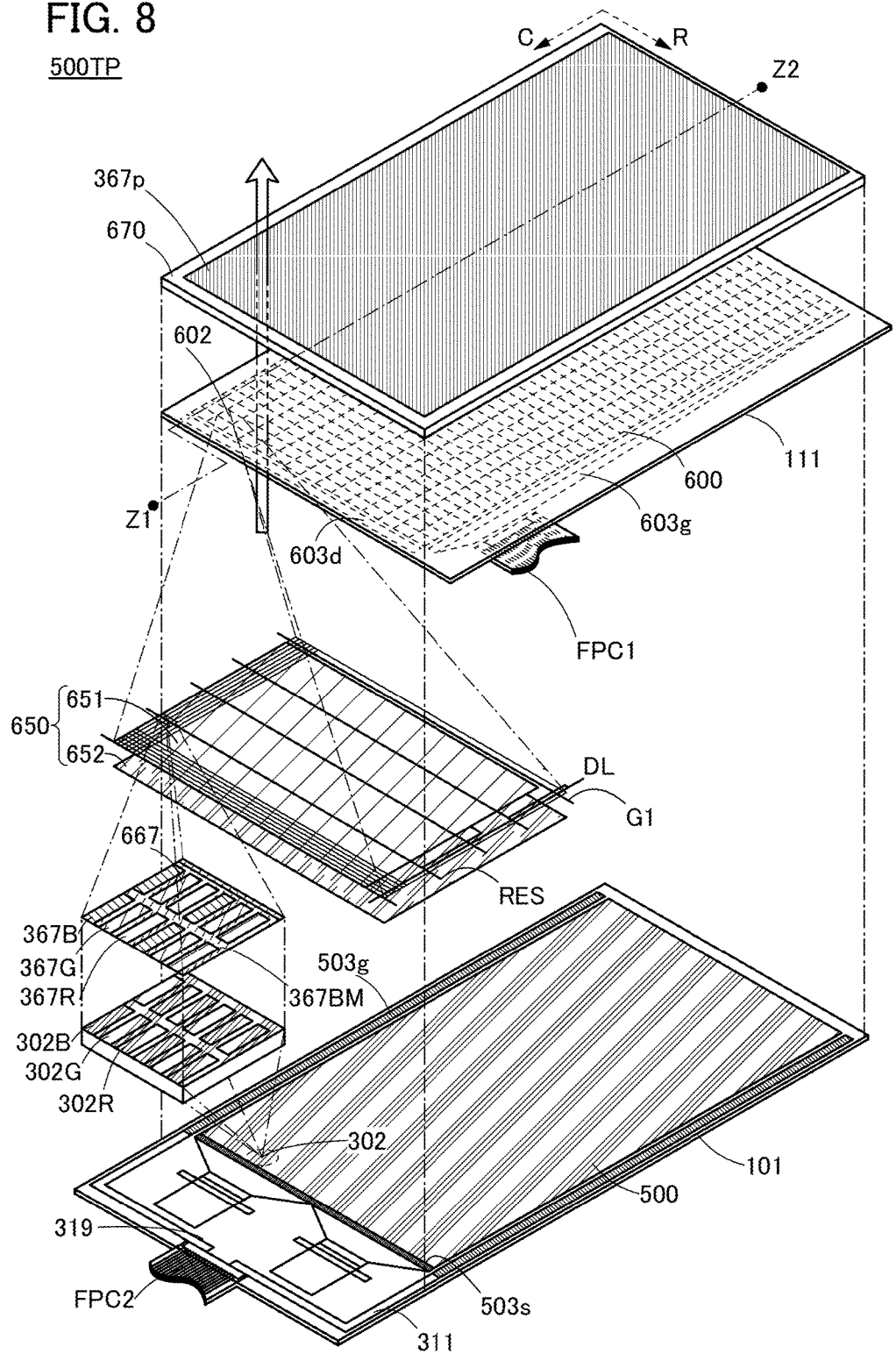

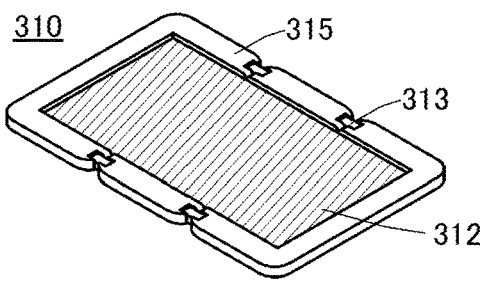
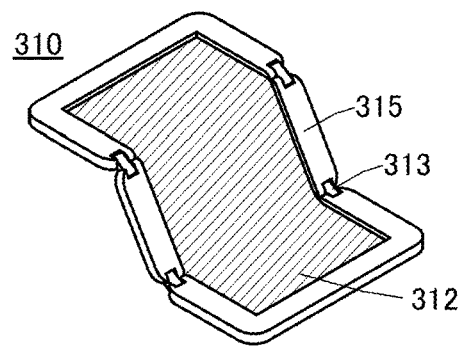
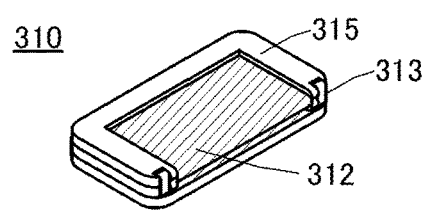
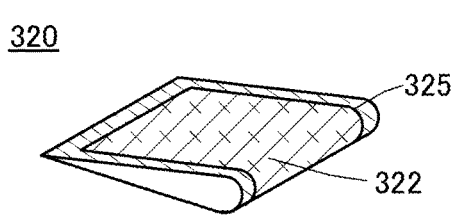
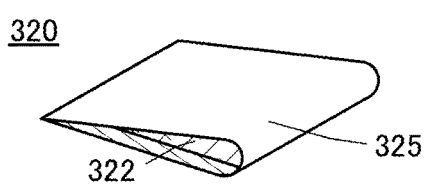
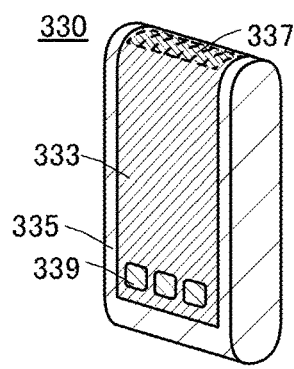
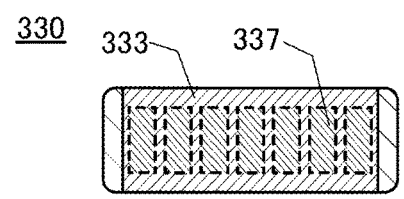
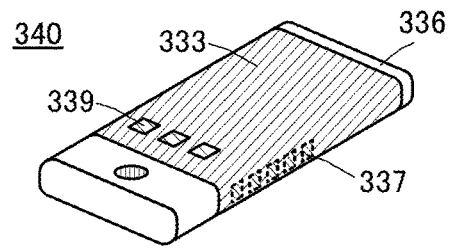
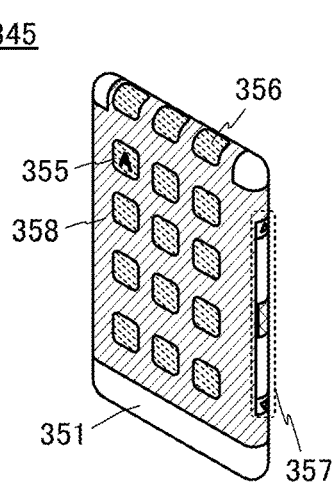

LIGHT-EMITTING DEVICE, MODULE, AND ELECTRONIC DEVICE

BACKGROUND OF THE INVENTION

1. Field of the Invention

One embodiment of the present invention relates to a light-emitting device, an input/output device, and an electronic device, and particularly to a flexible light-emitting device, a flexible input/output device, and a flexible electronic device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification can include a semiconductor device, a display device, a light-emitting device, a power storage device, a storage device, an electronic device, a lighting device, an input device (e.g., a touch sensor), an output device, an input/output device (e.g., a touch panel), a method for driving any of them, and a method for manufacturing any of them.

2. Description of the Related Art

Light-emitting elements utilizing electroluminescence (also referred to as EL elements) have features of the ease of being thinner and lighter, high speed response to input signals, capability of DC low voltage driving and the like and have been expected to be applied to display devices and lighting devices.

Furthermore, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

Patent Document 1 discloses a flexible active matrix light-emitting device in which an organic EL element and a transistor serving as a switching element are provided over a film substrate.

Display devices are expected to be applied to a variety of uses and become diversified. For example, a smartphone and a tablet terminal with a touch panel are being developed as portable information terminals.

REFERENCE

Patent Document

[Patent Document 1] Japanese Published Patent Application No. 2003-174153

SUMMARY OF THE INVENTION

An object of one embodiment of the present invention is to provide a device in which warpage or distortion is less likely to occur even in a high-temperature or high-humidity environment. Another object of one embodiment of the present invention is to provide a highly reliable device. Another object of one embodiment of the present invention is to provide a device with high resistance to repeated bending. Another object of one embodiment of the present invention is to provide a device which is lightweight, thin, or flexible. Another object of one embodiment of the present invention is to provide a novel device such as a semiconductor device, a light-emitting device, a display device, an input/output device, an electronic device, or a lighting device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a first flexible substrate, a second flexible substrate, and an element layer. The first flexible substrate includes an organic resin. The second flexible substrate includes an organic resin. The element layer is positioned between the first flexible substrate and the second flexible substrate. The element layer includes a light-emitting element. The light-emitting element has a function of emitting light to the first flexible substrate side. The first flexible substrate includes a first portion. The second flexible substrate includes a second portion. The first portion has higher average transmittance of light having a wavelength of greater than or equal to 400 nm and less than or equal to 800 nm than the second portion.

Another embodiment of the present invention is a light-emitting device including a first flexible substrate, a second flexible substrate, and an element layer. The first flexible substrate includes an organic resin. The second flexible substrate includes an organic resin. The element layer is positioned between the first flexible substrate and the second flexible substrate. The element layer includes a light-emitting element. The light-emitting element has a function of emitting light to the first flexible substrate side. The first flexible substrate includes a third portion. The second flexible substrate includes a fourth portion. The fourth portion is yellower than the third portion.

Note that the phrase "the fourth portion is yellower than the third portion" means that the fourth portion and the third portion individually absorb light in a specific wavelength region and reflect light in the other wavelength region, and thus the fourth portion looks yellower than the third portion to a user of the light-emitting device. For example, it can also be said that the fourth portion has a higher reflectance of light in the yellow wavelength range (e.g. greater than or equal to 570 nm and less than or equal to 590 nm) than the third portion, or the fourth portion has higher absorptance of light in the wavelength range of a complementary color of yellow (e.g. greater than or equal to 450 nm and less than or equal to 495 nm) than the third portion.

In each of the above structures, the first flexible substrate may include a fifth portion, the second flexible substrate includes a sixth portion, and a difference in coefficient of linear expansion between the fifth portion and the sixth portion is preferably 15 ppm/K or less, further preferably 10 ppm/K or less, still further preferably 5 ppm/K or less, particularly preferably 3 ppm/K or less.

In each of the above structures, the first flexible substrate may include a seventh portion, the second flexible substrate includes an eighth portion, and a difference in thickness between the seventh portion and the eighth portion is preferably 10 μm or less, further preferably 5 μm or less, still further preferably 3 μm or less, particularly preferably 1.5 μm or less.

In each of the above structures, the first flexible substrate and the second flexible substrate may include the same material.

In each of the above structures, a first bonding layer positioned between the first flexible substrate and the element layer and a second bonding layer positioned between the second flexible substrate and the element layer may be included. In this case, a difference between the total thickness of the first flexible substrate and the first bonding layer and the total thickness of the second flexible substrate and the second bonding layer is preferably 10 μm or less, further preferably 5 μm or less, still further preferably 3 μm or less, particularly preferably 1.5 μm or less. Furthermore, the first bonding layer includes a ninth portion, the second bonding layer includes a tenth portion, and a difference in thickness between the ninth portion and the tenth portion is preferably 10 μm or less, further preferably 5 μm or less, still further preferably 3 μm or less, particularly preferably 1.5 μm or less.

In each of the above structures, the first flexible substrate may include an eleventh portion, the second flexible substrate may include a twelfth portion, and the glass transition temperature of the twelfth portion may be higher than that of the eleventh portion.

Another embodiment of the present invention is a module including the light-emitting device with any of the above structures and a flexible printed circuit (FPC).

In addition, an input/output device to which any of the above structures is applied is also one embodiment of the present invention. For example, the input/output device of one embodiment of the present invention may include a light-emitting element or a display element, and a sensor element or a touch sensor in the element layer.

Embodiments of the present invention also include an electronic device including the light-emitting device or the input/output device which has any of the above structures and a lighting device including the light-emitting device or the input/output device which has any of the above structures. For example, one embodiment of the present invention is an electronic device including the light-emitting device, the input/output device, or the module which has any of the above structures; and an antenna, a battery, a housing, a speaker, a microphone, an operation switch, or an operation button.

Note that the light-emitting device or the input/output device of one embodiment of the present invention in this specification and the like may include, in its category, modules such as a module provided with a connector such as an FPC or a tape carrier package (TCP) and a module directly mounted with an integrated circuit (IC) by a chip on glass (COG) method or the like. Alternatively, these modules may include, in its category, the light-emitting device or the input/output device of one embodiment of the present invention.

According to one embodiment of the present invention, a device in which warpage or distortion is less likely to occur even in a high-temperature or high-humidity environment can be provided. According to one embodiment of the present invention, a highly reliable device can be provided. According to one embodiment of the present invention, a device with high resistance to repeated bending can be provided. According to one embodiment of the present invention, a device which is lightweight, thin, or flexible can be provided. According to one embodiment of the present invention, a novel device such as a semiconductor device, a light-emitting device, a display device, an input/output device, an electronic device, or a lighting device can be provided.

Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

FIGS. 1A1 and 1A2, 1B, 1C, and 1D illustrate examples of a light-emitting device.
FIGS. 3A and 3B illustrate examples of a light-emitting device.
FIG. 8 illustrates an example of an input/output device.
FIGS. 11A to 11I illustrate examples of electronic devices.

DETAILED DESCRIPTION OF THE INVENTION

Figure 2A:
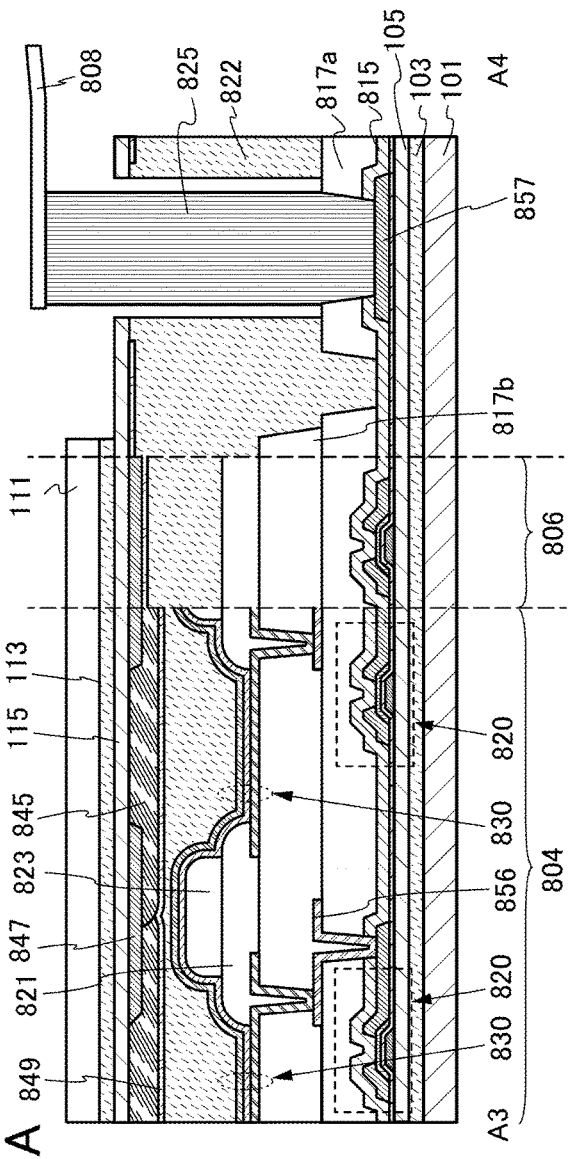
FIGS. 2A to 2C illustrate examples of a light-emitting device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is used for portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a light-emitting device of one embodiment of the present invention will be described with reference to FIGS. 1A1, 1A2, 1B, 1C, and 1D.

Although a light-emitting device mainly including an organic EL element is described in this embodiment as an example, one embodiment of the present invention is not limited to this example. A light-emitting device or a display device including another light-emitting element or display element which will be described later in this embodiment as an example is also one embodiment of the present invention. Moreover, one embodiment of the present invention is not limited to the light-emitting device or the display device and can be applied to a variety of devices such as a semiconductor device and an input/output device.

A layer to be peeled can be formed over a formation substrate, peeled from the formation substrate, and then transferred to another substrate. With this method, for example, a layer to be peeled which is formed over a formation substrate having high heat resistance can be transferred to a substrate having low heat resistance. Therefore, the manufacturing temperature of the layer to be peeled is not limited by the substrate having low heat resistance. Moreover, the layer to be peeled can be transferred to a substrate or the like which is more lightweight and flexible and thinner than the formation substrate, whereby a variety of devices such as a semiconductor device, a light-emitting device, a display device, and an input/output device can be made lightweight, flexible, and thin.

FIGS. 1A1 and 1A2 illustrate structure examples of a light-emitting device of this embodiment.

A light-emitting device illustrated in FIG. 1A1 includes a substrate 101, a bonding layer 103, an insulating layer 105, an element layer 106a, a bonding layer 107, a functional layer 106b, an insulating layer 115, a bonding layer 113, and a substrate 111. The substrates 101 and 111 are flexible. The element layer 106a includes at least one functional element. Examples of the functional element include a semiconductor element such as a transistor; a light-emitting element such as a light-emitting diode, an inorganic EL element, and an organic EL element; a display element such as a liquid crystal element; and a sensor element. The functional layer 106b includes, for example, a coloring layer (e.g., a color filter), a light-blocking layer (e.g., a black matrix), or the above functional element.

An example of a method for manufacturing the light-emitting device illustrated in FIG. 1A1 is shown here. First, a peeling layer is formed over a formation substrate, the insulating layer 105 is formed over the peeling layer, and the element layer 106a is formed over the insulating layer 105. In addition, a peeling layer is formed over another formation substrate, the insulating layer 115 is formed over the peeling layer, and the functional layer 106b is formed over the insulating layer 115. Then, the element layer 106a and the functional layer 106b are attached to each other so as to face each other with the bonding layer 107 provided therebetween. The formation substrate is separated from the insulating layer 105 with the peeling layer, and the insulating layer 105 is attached to the substrate 101 with the bonding layer 103. Similarly, the other formation substrate is separated from the insulating layer 115 with the peeling layer, and the insulating layer 115 is attached to the substrate 111 with the bonding layer 113. In the above manner, the light-emitting device illustrated in FIG. 1A1 can be manufactured.

Note that after the formation substrates are each separated from the insulating layer, the peeling layer may remain on the formation substrate side or the insulating layer side. As the peeling layer, an inorganic material or an organic resin can be used. Examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. For example, a stacked-layer structure including a layer containing tungsten and a layer containing an oxide of tungsten can be employed for the peeling layer. Examples of the organic resin include polyimide, polyester, polyolefin, polyamide, polycarbonate, and acrylic. Note that the organic resin may be used as the layer (e.g., the substrate) of the device. Alternatively, the organic resin may be removed and another substrate may be attached to the exposed surface of the layer to be peeled using an adhesive.

A light-emitting device illustrated in FIG. 1A2 includes the substrate 101, the bonding layer 103, the insulating layer 105, an element layer 106, the bonding layer 107, and the substrate 111.

An example of a method for manufacturing the light-emitting device illustrated in FIG. 1A2 is shown here. First, a peeling layer is formed over a formation substrate, the insulating layer 105 is formed over the peeling layer, the element layer 106 is formed over the insulating layer 105, and the element layer 106 and the substrate 111 are attached to each other with the bonding layer 107. The formation substrate is separated from the insulating layer 105 with the peeling layer, and the insulating layer 105 is attached to the substrate 101 with the bonding layer 103. In the above manner, the light-emitting device illustrated in FIG. 1A2 can be manufactured.

For example, an organic EL element is likely to deteriorate due to moisture or the like; therefore, reliability might be insufficient when the organic EL element is formed over an organic resin substrate having a poor moisture-proof property. Here, according to the above manufacturing methods, a protective film having an excellent moisture-proof property (corresponding to one or both of the insulating layer 105 and the insulating layer 115) is formed over a glass substrate at a high temperature, whereby the protective film can be transferred to a flexible organic resin substrate having low heat resistance and a poor moisture-proof property. A highly reliable flexible light-emitting device can be manufactured by forming an organic EL element over the protective film transferred to the organic resin substrate.

Another example is as follows: after a protective film having an excellent moisture-proof property is formed over a glass substrate at a high temperature and an organic EL element is formed over the protective film, the protective film and the organic EL element can be peeled from the glass substrate and transferred to a flexible organic resin substrate having a low heat resistance and a poor moisture-proof property. A highly reliable flexible light-emitting device can be manufactured by transferring the protective film and the organic EL element to the organic resin substrate.

Note that there are a plurality of properties required for substrates included in a flexible light-emitting device. For example, in order to obtain a flexible light-emitting device, a substrate needs to have flexibility. Furthermore, a substrate through which light is extracted from the light-emitting device is required to have a high visible light-transmitting property. In addition, a substrate where an FPC is pressure-bonded is required to have high heat resistance. Besides, in order to suppress cracks in the light-emitting device in a high-temperature or high-humidity environment, it is preferable that the coefficient of linear expansion of a substrate be small. It is very difficult for a material of the substrates to have all the properties.

Accordingly, in the light-emitting device of one embodiment of the present invention, different materials are used for the pair of substrates. Specifically, one embodiment of the present invention is a light-emitting device including a first flexible substrate, a second flexible substrate, and an element layer. The first flexible substrate includes an organic resin. The second flexible substrate includes an organic resin. The element layer is positioned between the first flexible substrate and the second flexible substrate. The element layer includes a light-emitting element. The light-emitting element emits light to the first flexible substrate side. The first flexible substrate has higher average transmittance of light having a wavelength of greater than or equal to 400 nm and less than or equal to 800 nm than the second flexible substrate.

Note that in one embodiment of the present invention, part of the first flexible substrate has higher average transmittance of light having a wavelength of greater than or equal to 400 nm and less than or equal to 800 nm than part of the second flexible substrate.

The second flexible substrate may be colored. The second flexible substrate may be semitransparent or opaque. The second flexible substrate may be yellower than the first flexible substrate.

In the light-emitting device of one embodiment of the present invention, a substrate having higher transmittance of visible light than the second flexible substrate is used as the first flexible substrate through which light from the light-emitting element is extracted. There is no limitation on the transmittance of visible light of the second flexible substrate, and accordingly, in the case where the other properties required for the substrate are taken into consideration, the range of choices of materials for the second flexible substrate is less likely to be narrowed. Accordingly, a substrate which is inexpensive, can be supplied stably, or can be easily mass-produced is selected easily as the second flexible substrate. Furthermore, it is preferable that the second flexible substrate have high heat resistance (e.g. a high glass transition temperature) or a small coefficient of linear expansion, or be inexpensive or mass-produced easily as compared with the first flexible substrate.

For example, in the case where an FPC is pressure-bonded to the second flexible substrate, the second flexible substrate preferably has a higher glass transition temperature than the first flexible substrate.

The thickness of a substrate accounts for a large part of the thickness of a flexible light-emitting device in many cases. Organic materials are more easily affected by a temperature and moisture than inorganic materials, and thus reversible or irreversible expansion or contraction is likely to occur. Accordingly, in the case where films containing an organic material such as an organic resin are used for a pair of substrates in the light-emitting device, when there is an imbalance in expansion or contraction between one substrate and the other substrate, stress is caused in the light-emitting device, resulting in occurrence of reversible or irreversible warpage in some cases.

Thus, in one embodiment of the present invention, the thicknesses of the first flexible substrate and the second flexible substrate are preferably the same. When the thicknesses of the pair of substrates are the same, warpage or distortion of the light-emitting device can be suppressed even in a high-temperature environment, a high-humidity environment, or the like. Furthermore, a light-emitting device with high resistance to repeated bending can be provided.

For example, a difference in thickness between the first flexible substrate and the second flexible substrate is preferably 10 μm or less, further preferably 5 μm or less, still further preferably 3 μm or less, particularly preferably 1.5 μm or less.

Note that one embodiment of the present invention is not limited to a structure in which the thicknesses of the pair of flexible substrates are the same. Warpage, distortion, or the like of the light-emitting device may be suppressed in such a manner that other physical values of the pair of flexible substrates are made the same.

In one embodiment of the present invention, the coefficients of linear expansion of the first flexible substrate and the second flexible substrate are preferably the same. When the coefficients of linear expansion of the pair of substrates are the same, warpage or distortion of the light-emitting device can be suppressed even in a high-temperature environment, a high-humidity environment, or the like. Furthermore, a light-emitting device with high resistance to repeated bending can be provided. An imbalance in expansion or contraction due to heat between the pair of flexible substrates is a cause of a crack in the light-emitting device. This indicates that a difference in coefficient of linear expansion between the pair of flexible substrates is preferably small.

For example, a difference in coefficient of linear expansion between the first flexible substrate and the second flexible substrate is preferably 15 ppm/K or less, further preferably 10 ppm/K or less, still further preferably 5 ppm/K or less, particularly preferably 3 ppm/K or less.

Furthermore, the first flexible substrate and the second flexible substrate may include the same material.

In one embodiment of the present invention, a first bonding layer positioned between the first flexible substrate and the element layer and a second bonding layer positioned between the second flexible substrate and the element layer may be included.

An adhesive including an organic material can be used for the bonding layers. Such an adhesive is more easily affected by a temperature and moisture than inorganic materials, and thus reversible or irreversible expansion or contraction is likely to occur.

Accordingly, in one embodiment of the present invention, the thicknesses of the first bonding layer and the second bonding layer are preferably the same. When the thicknesses of the pair of bonding layers are the same, warpage or distortion of the light-emitting device can be suppressed even in a high-temperature environment, a high-humidity environment, or the like. Furthermore, a light-emitting device with high resistance to repeated bending can be provided.

For example, a difference in thickness between the first bonding layer and the second bonding layer is preferably 10 μm or less, further preferably 5 μm or less, still further preferably 3 μm or less, particularly preferably 1.5 μm or less.

Furthermore, a difference between the total thickness of the first flexible substrate and the first bonding layer and the total thickness of the second flexible substrate and the second bonding layer is preferably 10 μm or less, further preferably 5 μm or less, still further preferably 3 μm or less, particularly preferably 1.5 μm or less. When the total thickness of the flexible substrate and the bonding layer which are positioned on one surface side and the total thickness of the flexible substrate and the bonding layer which are positioned on the other surface side are the same in the light-emitting device, warpage or distortion of the light-emitting device can be suppressed even in a high-temperature environment, a high-humidity environment, or the like. Furthermore, a light-emitting device with high resistance to repeated bending can be provided.

Note that one embodiment of the present invention is not limited to a structure in which the thicknesses of the pair of bonding layers are the same. Warpage, distortion, or the like of the light-emitting device may be suppressed in such a manner that other physical values of the pair of bonding layers are made the same.

In one embodiment of the present invention, the coefficients of linear expansion of the first bonding layer and the second bonding layer are preferably the same. When the coefficients of linear expansion of the pair of bonding layers are the same, warpage or distortion of the light-emitting device can be suppressed even in a high-temperature environment, a high-humidity environment, or the like. Furthermore, a light-emitting device with high resistance to repeated bending can be provided. An imbalance in expansion or contraction due to heat between the pair of bonding layers is a cause of a crack in the light-emitting device. This indicates that a difference in coefficient of linear expansion between the pair of bonding layers is preferably small.

For example, a difference in coefficient of linear expansion between the first bonding layer and the second bonding layer is preferably 15 ppm/K or less, further preferably 10 ppm/K or less, still further preferably 5 ppm/K or less, particularly preferably 3 ppm/K or less.

Specific examples of the light-emitting device of one embodiment of the present invention are described below.

Specific Example 1

FIG. 1B is a plan view of the light-emitting device, and FIG. 1D is an example of a cross-sectional view taken along the dashed-dotted line A1-A2 in FIG. 1B. The light-emitting device in Specific Example 1 is a top-emission light-emitting device using a color filter method. In this embodiment, the light-emitting device can have a structure in which sub-pixels of three colors of, for example, red (R), green (G), and blue (B) express one color, a structure in which sub-pixels of four colors of R, G, B, and white (W) express one color, a structure in which sub-pixels of four colors of R, G, B, and yellow (Y) express one color, or the like. The color element is not particularly limited and colors other than R, G, B, W, and Y may be used. For example, cyan, magenta, or the like may be used.

The light-emitting device illustrated in FIG. 1B includes a light-emitting portion 804, a driver circuit portion 806, and an FPC 808.

The light-emitting device in FIG. 1D includes the substrate 101, the bonding layer 103, the insulating layer 105, a plurality of transistors, a conductive layer 857, an insulating layer 815, an insulating layer 817, a plurality of light-emitting elements, an insulating layer 821, a bonding layer 822, a coloring layer 845, a light-blocking layer 847, the insulating layer 115, the bonding layer 113, and the substrate 111. The bonding layer 822, the insulating layer 115, the bonding layer 113, and the substrate 111 transmit visible light. Light-emitting elements and transistors included in the light-emitting portion 804 and the driver circuit portion 806 are sealed with the substrate 101, the substrate 111, and the bonding layer 822.

The light-emitting portion 804 includes a transistor 820 and a light-emitting element 830 over the substrate 101 with the bonding layer 103 and the insulating layer 105 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. It is preferable that the lower electrode 831 reflect visible light. The upper electrode 835 transmits visible light.

In addition, the light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the bonding layer 822.

The insulating layer 815 has an effect of inhibiting diffusion of impurities to a semiconductor included in the transistor. As the insulating layer 817, an insulating layer having a planarization function is preferably selected in order to reduce surface unevenness due to the transistor.

The driver circuit portion 806 includes a plurality of transistors over the substrate 101 with the bonding layer 103 and the insulating layer 105 provided therebetween. In FIG. 1D, one of the transistors included in the driver circuit portion 806 is illustrated.

The insulating layer 105 and the substrate 101 are attached to each other with the bonding layer 103. The insulating layer 115 and the substrate 111 are attached to each other with the bonding layer 113. It is preferable to use a film having an excellent moisture-proof property as at least one of the insulating layer 105 and the insulating layer 115, in which case entry of an impurity such as moisture into the light-emitting element 830 or the transistor 820 can be inhibited, leading to improved reliability of the light-emitting device.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the light-emitting device in FIG. 1D, the FPC 808 is positioned over the substrate 111. A connector 825 is connected to the conductive layer 857 through an opening provided in the substrate 111, the bonding layer 113, the insulating layer 115, the bonding layer 822, the insulating layer 817, and the insulating layer 815. Moreover, the connector 825 is connected to the FPC 808. The FPC 808 and the conductive layer 857 are electrically connected to each other with the connector 825 provided therebetween. In the case where the conductive layer 857 and the substrate 111 overlap with each other, the conductive layer 857, the connector 825, and the FPC 808 are electrically connected to one another by forming an opening in the substrate 111 (or using a substrate having an opening).

The substrate 111 is a substrate through which light from the light-emitting element 830 is extracted. Accordingly, substrate 111 preferably has higher average transmittance of light having a wavelength of greater than or equal to 400 nm and less than or equal to 800 nm than the substrate 101.

The substrate 101 is a substrate to which an FPC is pressure-bonded. Accordingly, the substrate 101 preferably has a higher glass transition temperature than the substrate 111.

Specific Example 2

FIG. 1C is a plan view of the light-emitting device, and FIG. 2A is an example of a cross-sectional view taken along the dashed-dotted line A3-A4 in FIG. 1C. The light-emitting device in Specific Example 2 is a top-emission light-emitting device using a color filter method, which differs from the light-emitting device in Specific Example 1. Here, only different points from those of Specific Example 1 are described and the description of the same points as Specific Example 1 is omitted.

The light-emitting device illustrated in FIG. 2A differs from the light-emitting device in FIG. 1D in the following points.

The light-emitting device illustrated in FIG. 2A includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting device in FIG. 2A includes a spacer 823 over the insulating layer 821. The spacer 823 can adjust the distance between the substrate 101 and the substrate 111.

The light-emitting device in FIG. 2A includes an overcoat 849 covering the coloring layer 845 and the light-blocking layer 847. The space between the light-emitting element 830 and the overcoat 849 is filled with the bonding layer 822.

In addition, in the light-emitting device in FIG. 2A, the substrate 101 differs from the substrate 111 in size. The FPC 808 is positioned over the insulating layer 115 and does not overlap with the substrate 111. The connector 825 is connected to the conductive layer 857 through an opening provided in the insulating layer 115, the bonding layer 822, the insulating layer 817a, and the insulating layer 815. Since it is not necessary to form an opening in the substrate 111, the material of the substrate 111 is not limited.

Figure 2B:
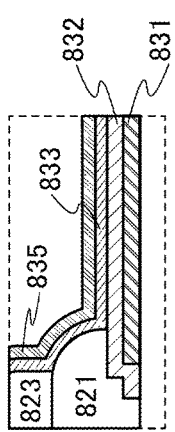

Note that as illustrated in FIG. 2B, the light-emitting element 830 may include an optical adjustment layer 832 between the lower electrode 831 and the EL layer 833. It is preferable to use a conductive material having a light-transmitting property for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer may be varied depending on the color of the sub-pixel.

Specific Example 3

Figure 2C:
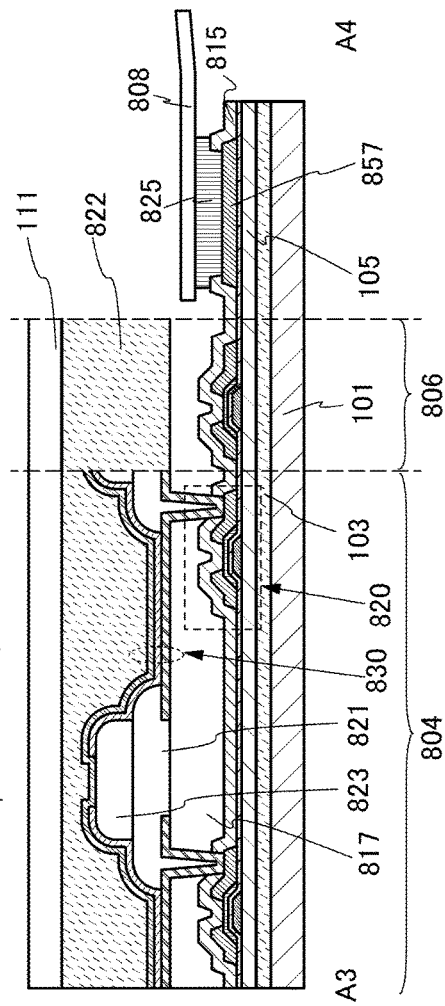

FIG. 1C is a plan view of the light-emitting device, and FIG. 2C is an example of a cross-sectional view taken along the dashed-dotted line A3-A4 in FIG. 1C. The light-emitting device in Specific Example 3 is a top-emission light-emitting device using a separate coloring method.

The light-emitting device in FIG. 2C includes the substrate 101, the bonding layer 103, the insulating layer 105, a plurality of transistors, the conductive layer 857, the insulating layer 815, the insulating layer 817, a plurality of light-emitting elements, the insulating layer 821, the spacer 823, the bonding layer 822, and the substrate 111. The bonding layer 822 and the substrate 111 transmit visible light.

In the light-emitting device in FIG. 2C, the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other with the connector 825 provided therebetween.

Specific Example 4

FIG. 1C is a plan view of the light-emitting device, and FIG. 3A is an example of a cross-sectional view taken along the dashed-dotted line A3-A4 in FIG. 1C. The light-emitting device in Specific Example 4 is a bottom-emission light-emitting device using a color filter method.

The light-emitting device in FIG. 3A includes the substrate 101, the bonding layer 103, the insulating layer 105, a plurality of transistors, the conductive layer 857, the insulating layer 815, the coloring layer 845, the insulating layer 817a, the insulating layer 817b, the conductive layer 856, a plurality of light-emitting elements, the insulating layer 821, the bonding layer 822, and the substrate 111. The substrate 101, the bonding layer 103, the insulating layer 105, the insulating layer 815, the insulating layer 817a, and the insulating layer 817b transmit visible light.

The light-emitting portion 804 includes the transistor 820, a transistor 824, and the light-emitting element 830 over the substrate 101 with the bonding layer 103 and the insulating layer 105 provided therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. It is preferable that the upper electrode 835 reflect visible light. The lower electrode 831 transmits visible light. The location of the coloring layer 845 overlapping with the light-emitting element 830 is not particularly limited and may be, for example, between the insulating layer 817a and the insulating layer 817b or between the insulating layer 815 and the insulating layer 817a.

The driver circuit portion 806 includes a plurality of transistors over the substrate 101 with the bonding layer 103 and the insulating layer 105 provided therebetween. In FIG. 3A, two of the transistors included in the driver circuit portion 806 is illustrated.

The insulating layer 105 and the substrate 101 are attached to each other with the bonding layer 103. It is preferable to use a film having an excellent moisture-proof property as the insulating layer 105, in which case entry of an impurity such as moisture into the light-emitting element 830 or the transistors 820 and 824 can be inhibited, leading to improved reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. Here, an example is described in which the conductive layer 857 is formed using the same material and the same step(s) as those of the conductive layer 856.

The substrate 101 is a substrate through which light from the light-emitting element 830 is extracted. Accordingly, the substrate 101 preferably has higher average transmittance of light having a wavelength of greater than or equal to 400 nm and less than or equal to 800 nm than the substrate 111.

The substrate 101 is a substrate to which an FPC is pressure-bonded. Accordingly, the substrate 101 preferably has a higher glass transition temperature than the substrate 111.

Specific Example 5

FIG. 3B shows an example of a light-emitting device different from those of Specific Examples 1 to 4.

A light-emitting device in FIG. 3B includes the substrate 101, the bonding layer 103, the insulating layer 105, a conductive layer 814, a conductive layer 857a, a conductive layer 857b, the light-emitting element 830, the insulating layer 821, the bonding layer 822, and the substrate 111.

The conductive layer 857a and the conductive layer 857b, which are external connection electrodes of the light-emitting device, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

In this embodiment, the case where the light-emitting element 830 has a bottom emission structure is described as an example. The substrate 101 is a substrate through which light from the light-emitting element 830 is extracted. Accordingly, the substrate 101 preferably has higher average transmittance of light having a wavelength of greater than or equal to 400 nm and less than or equal to 800 nm than the substrate 111.

The substrate 101 is a substrate to which an FPC is pressure-bonded. Accordingly, the substrate 101 preferably has a higher glass transition temperature than the substrate 111.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate, the lens or the film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, or aluminum, an alloy material containing any of these materials as its main component, and the like. The thickness of the conductive layer 814 can be greater than or equal to 0.1 µm and less than or equal to 3 µm, preferably greater than or equal to 0.1 µm and less than or equal to 0.5 µm, for example.

Examples of Materials

Next, materials and the like that can be used for a light-emitting device are described. Note that description on the components already described in this specification and the like is omitted in some cases.

As materials for the substrates, glass, quartz, an organic resin, metal, an alloy, or the like can be used. The substrate through which light from the light-emitting element is extracted is formed using a material which transmits the light.

In particular, a flexible substrate is preferably used. For example, an organic resin; or glass, a metal, or an alloy that is thin enough to have flexibility can be used.

An organic resin, which has a specific gravity smaller than that of glass, is preferably used for the flexible substrate, in which case the light-emitting device can be lightweight as compared with the case where glass is used.

The substrate is preferably formed using a material with high toughness. In that case, a light-emitting device with high impact resistance that is less likely to be broken can be provided. For example, when an organic resin substrate or a thin metal or alloy substrate is used, the light-emitting device can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the light-emitting device. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, or a metal alloy such as an aluminum alloy or stainless steel.

Furthermore, when a material with high thermal emissivity is used for the substrate, the surface temperature of the light-emitting device can be prevented from rising, leading to inhibition of breakage or a decrease in reliability of the light-emitting device. For example, the substrate may have a stacked-layer structure of a metal substrate and a layer with high thermal emissivity (the layer can be formed using a metal oxide or a ceramic material, for example).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a cycloolefin resin, a polystyrene resin, a polyamide imide resin, and a polyvinyl chloride resin. In particular, a material having a low coefficient of linear expansion is preferable, and for example, a polyamide imide resin, a polyimide resin, or PET can be suitably used. A substrate in which a fibrous body is impregnated with a resin (also referred to as prepreg) or a substrate whose coefficient of linear expansion is reduced by mixing an organic resin with an inorganic filler can also be used.

The flexible substrate may have a stacked-layer structure in which a hard coat layer (e.g., a silicon nitride layer) by which a surface of the light-emitting device is protected from damage, a layer which can disperse pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a highly reliable light-emitting device can be provided.

For example, a flexible substrate in which a glass layer, a bonding layer, and an organic resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. By providing such an organic resin layer outside the glass layer, occurrence of a crack or a break in the glass layer can be inhibited and mechanical strength can be improved. With the substrate that includes such a composite material of a glass material and an organic resin, a highly reliable flexible light-emitting device can be provided.

As the bonding layer, a variety of curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, a bonding sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case entry of impurities such as moisture into the functional element can be inhibited and the reliability of the light-emitting device can be improved.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

An insulating film having an excellent moisture-proof property is preferably used for the insulating layer 105 and/or the insulating layer 115. Alternatively, the insulating layer 105 and/or the insulating layer 115 preferably have a function of preventing diffusion of impurities to a light-emitting element.

As an insulating film having an excellent moisture-proof property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having an excellent moisture-proof property is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

In the light-emitting device, it is necessary that at least one of the insulating layers 105 and 115 transmit light emitted from the light-emitting element included in the element layer 106a or the element layer 106. One of the insulating layers 105 and 115, which transmits light emitted from the light-emitting element, preferably has higher average transmittance of light having a wavelength of greater than or equal to 400 nm and less than or equal to 800 nm than the other.

The insulating layers 105 and 115 each preferably include oxygen, nitrogen, and silicon. The insulating layers 105 and 115 each preferably include, for example, silicon oxynitride. Moreover, the insulating layers 105 and 115 each preferably include silicon nitride or silicon nitride oxide. It is preferable that the insulating layers 105 and 115 be each formed using a silicon oxynitride film and a silicon nitride film, which are in contact with each other. The silicon oxynitride film and the silicon nitride film are alternately stacked so that antiphase interference occurs more often in a visible region, whereby the stack can have higher transmittance of light in the visible region.

There is no particular limitation on the structure of the transistor in the light-emitting device. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the insulating layer 105 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. In addition, lanthanum, neodymium, germanium, or the like may be added to the metal material or the alloy. Moreover, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Furthermore, when a metal film or a metal oxide film is stacked on and in contact with an aluminum alloy film, oxidation of the aluminum alloy film can be inhibited. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the wavelength range in a visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the light-emitting device.

As the insulating layer 815, for example, an inorganic insulating film such as a silicon oxide film, a silicon oxynitride film, or an aluminum oxide film can be used. For example, as the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

For the insulating layer 821, an organic insulating material or an inorganic insulating material is used. As the resin, for example, a polyimide resin, a polyamide resin, an acrylic resin, a siloxane resin, an epoxy resin, or a phenol resin can be used. It is particularly preferable that the insulating layer 821 be formed to have an opening over the lower electrode 831 and an inclined side wall with curvature, using a photosensitive resin material.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the light-emitting device, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, a yellow (Y) color filter for transmitting light in a yellow wavelength range, or the like can be used. Each coloring layer is formed in a desired position with any of a variety of materials by a printing method, an inkjet method, an etching method using a photolithography method, or the like. In a white sub-pixel, a resin such as a transparent resin or a white resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

Note that although the light-emitting device is described as an example in this embodiment, one embodiment of the present invention can be applied to a variety of devices such as a semiconductor device, a display device, and an input/output device.

In this specification and the like, a display element, a display device which is a device including a display element, a light-emitting element, and a light-emitting device which is a device including a light-emitting element can employ various modes or can include various elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element including a micro electro mechanical system (MEMS), a digital micromirror device (DMD), a digital micro shutter (DMS), an interferometric modulator display (IMOD) element, an MEMS shutter display element, optical interference type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, ELECTRONIC LIQUID POWDER (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum or silver. Furthermore, in such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

For example, in this specification and the like, an active matrix method in which an active element (a non-linear element) is included in a pixel or a passive matrix method in which an active element is not included in a pixel can be used.

In the active matrix method, as an active element, not only a transistor but also a variety of active elements can be used. For example, a metal insulator metal (MIM), a thin film diode (TFD), or the like can also be used. Since these elements can be formed with a smaller number of manufacturing steps, manufacturing cost can be reduced or a yield can be improved. Alternatively, since the size of these elements is small, the aperture ratio can be improved, so that power consumption can be reduced or higher luminance can be achieved.

Since an active element is not used in the passive matrix method, the number of manufacturing steps is small, so that manufacturing cost can be reduced or a yield can be improved. Alternatively, since an active element is not used, the aperture ratio can be improved, so that power consumption can be reduced or higher luminance can be achieved, for example.

Note that the light-emitting device of one embodiment of the present invention may be used as a display device or as a lighting device. For example, it may be used as a light source such as a backlight or a front light, that is, a lighting device for a display panel.

As described in this embodiment, the pair of substrates may have the same thickness in the light-emitting device of one embodiment of the present invention, whereby even when different materials are used for one substrate and the other substrate, warpage or distortion of the light-emitting device can be suppressed regardless of a preservation environment. When warpage or distortion of the light-emitting device is suppressed, a decrease in the display quality of the light-emitting device or occurrence of cracks in the light-emitting device can be prevented, leading to higher reliability. Furthermore, the one substrate and the other substrate can have their respectively required properties, and accordingly the range of choices for the materials can be widened. In addition, a light-emitting device with high resistance to repeated bending can be provided.

This embodiment can be combined with any other embodiment as appropriate.

Embodiment 2

In this embodiment, an input/output device of one embodiment of the present invention will be described with reference to drawings. Note that the above description can be referred to for the components of an input/output device, which are similar to those of the light-emitting device described in Embodiment 1. Although an input/output device including a light-emitting element is described as an example in this embodiment, one embodiment of the present invention is not limited thereto. For example, an input/output device including another element (e.g., a display element), the example of which is shown in Embodiment 1, is also one embodiment of the present invention. Moreover, the input/output device described in this embodiment can also be referred to as a touch panel.

A pair of substrates may have the same thickness in the input/output device of one embodiment of the present invention, whereby even when different materials are used for one substrate and the other substrate, warpage or distortion of the input/output device can be suppressed regardless of a preservation environment. When warpage or distortion of the input/output device is suppressed, a decrease in the display quality or the sensitivity of the input/output device or occurrence of cracks in the input/output device can be prevented, leading to higher reliability. Furthermore, the one substrate and the other substrate can have their respectively required properties, and accordingly the range of choices for the materials can be widened. In addition, an input/output device with high resistance to repeated bending can be provided.

Structure Example 1

Figure 4A:
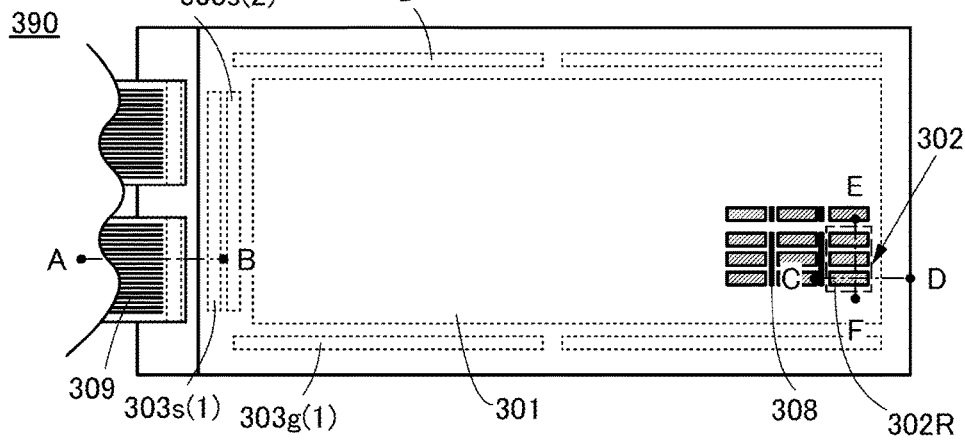
FIGS. 4A to 4C illustrate an example of an input/output device.
Figure 4B:
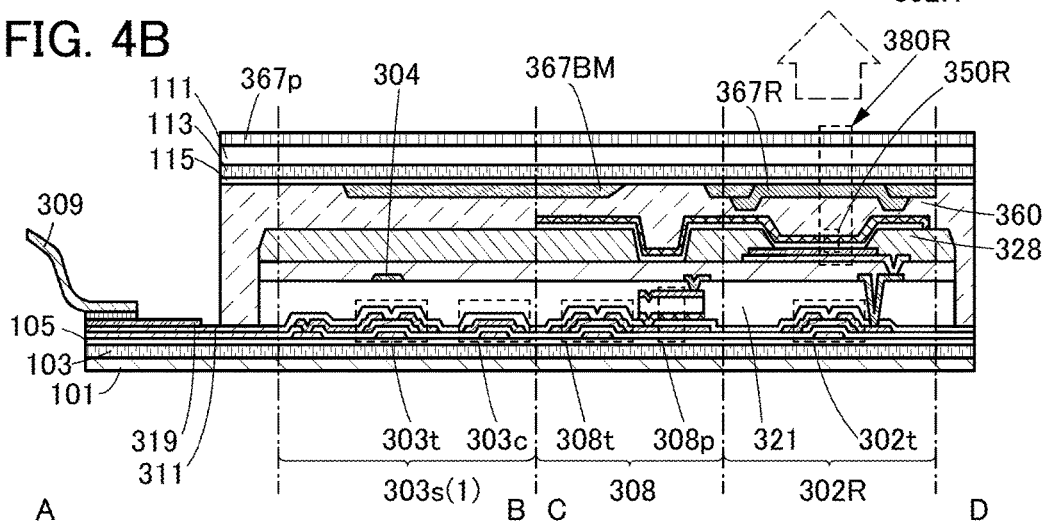
Figure 4C:
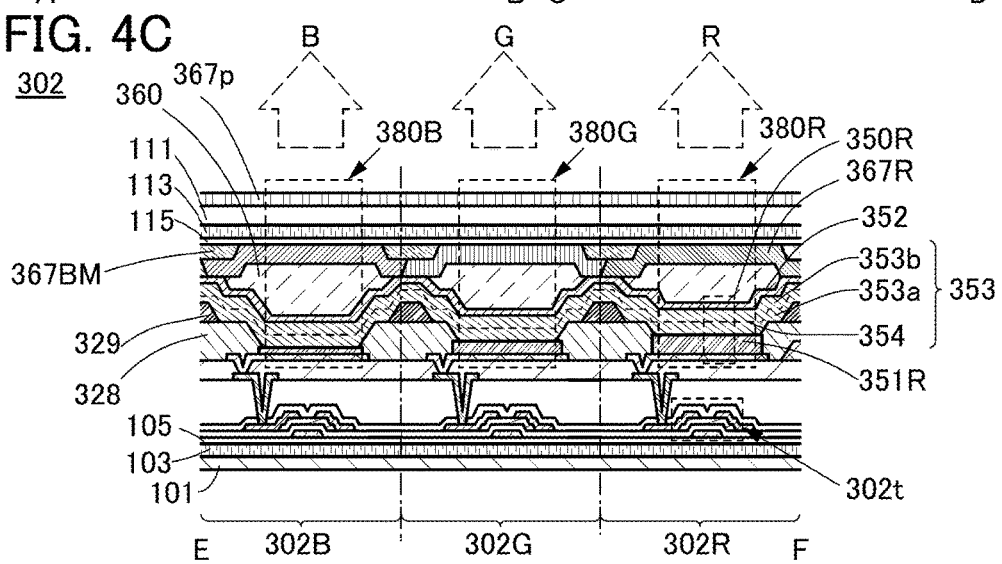

FIG. 4A is a top view of the input/output device. FIG. 4B is a cross-sectional view taken along the dashed-dotted line A-B and dashed-dotted line C-D in FIG. 4A. FIG. 4C is a cross-sectional view taken along the dashed-dotted line E-F in FIG. 4A.

An input/output device 390 illustrated in FIG. 4A includes a display portion 301 (serving also as an input portion), a scan line driver circuit 303$g$(1), an imaging pixel driver circuit 303$g$(2), an image signal line driver circuit 303$s$(1), and an imaging signal line driver circuit 303$s$(2).

The display portion 301 includes a plurality of pixels 302 and a plurality of imaging pixels 308.

The pixel 302 includes a plurality of sub-pixels (e.g., a sub-pixel 302R). Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303$g$(1) can supply selection signals to the pixels 302.

The image signal line driver circuit 303$s$(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 4B and 4C, the input/output device 390 includes the substrate 101, the bonding layer 103, the insulating layer 105, the substrate 111, the bonding layer 113, and the insulating layer 115. The substrates 101 and 111 are attached to each other with a bonding layer 360.

The substrate 101 and the insulating layer 105 are attached to each other with the bonding layer 103. The substrate 111 and the insulating layer 115 are attached to each other with the bonding layer 113. Embodiment 1 can be referred to for materials used for the substrates, the bonding layers, and the insulating layers.

Each of the pixels 302 includes the sub-pixel 302R, a sub-pixel 302G, and a sub-pixel 302B (see FIG. 4C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit. The pixel circuit includes a transistor 302t that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 4C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes the bonding layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the bonding layer 360 and through the coloring layer 367R and is emitted to the outside of the light-emitting module 380R as indicated by an arrow in FIG. 4B or 4C.

The input/output device 390 includes a light-blocking layer 367BM. The light-blocking layer 367BM is provided so as to surround the coloring layer (e.g., the coloring layer 367R).

The input/output device 390 includes an anti-reflective layer 367p positioned in a region overlapping with the display portion 301. As the anti-reflective layer 367p, a circular polarizing plate can be used, for example.

The substrate 111 is a substrate through which light from the light-emitting element is extracted. Accordingly, the substrate 111 preferably has higher average transmittance of light having a wavelength of greater than or equal to 400 nm and less than or equal to 800 nm than the substrate 101.

The substrate 101 is a substrate to which an FPC is pressure-bonded. Accordingly, the substrate 101 preferably has a higher glass transition temperature than the substrate 111.

In the input/output device of one embodiment of the present invention, the total thickness of the substrate 101 and the bonding layer 103 may be the same as that of the substrate 111 and the bonding layer 113. Alternatively, the total thickness of the substrate 101 and the bonding layer 103 may be the same as that of the substrate 111, the bonding layer 113, and the anti-reflective layer 367p.

The input/output device 390 includes an insulating layer 321. The insulating layer 321 covers the transistor 302t and the like. Note that the insulating layer 321 can be used as a layer for planarizing unevenness caused by the pixel circuits and the imaging pixel circuits. An insulating layer on which a layer that can inhibit diffusion of impurities to the transistor 302t and the like is stacked can be used as the insulating layer 321.

The input/output device 390 includes a partition 328 that overlaps with an end portion of the lower electrode 351R. In addition, a spacer 329 that controls the distance between the substrate 101 and the substrate 111 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 4B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The input/output device 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302t, 303t, and 308t can be formed in the same process. Alternatively, the transistors may be formed in different processes.

Structure Example 2

Figure 5A:
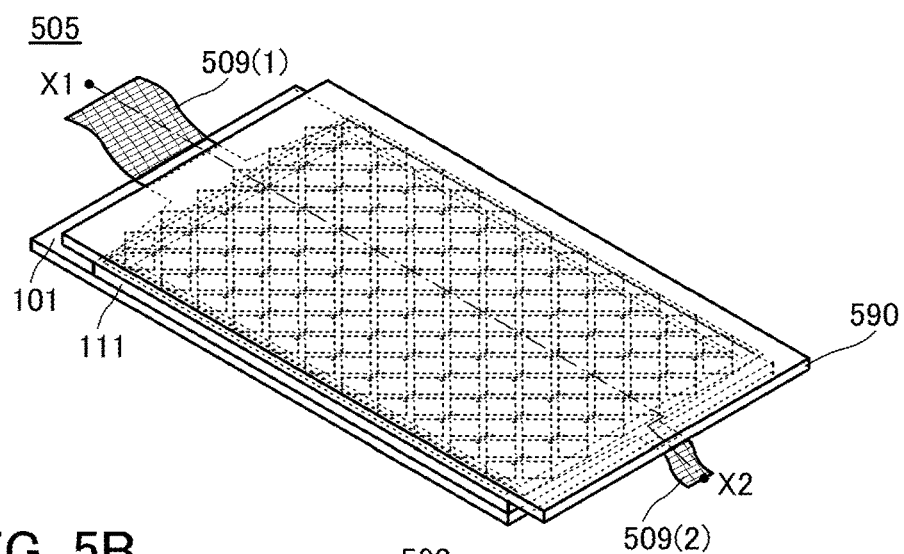
FIGS. 5A and 5B illustrate an example of an input/output device.
Figure 5B:
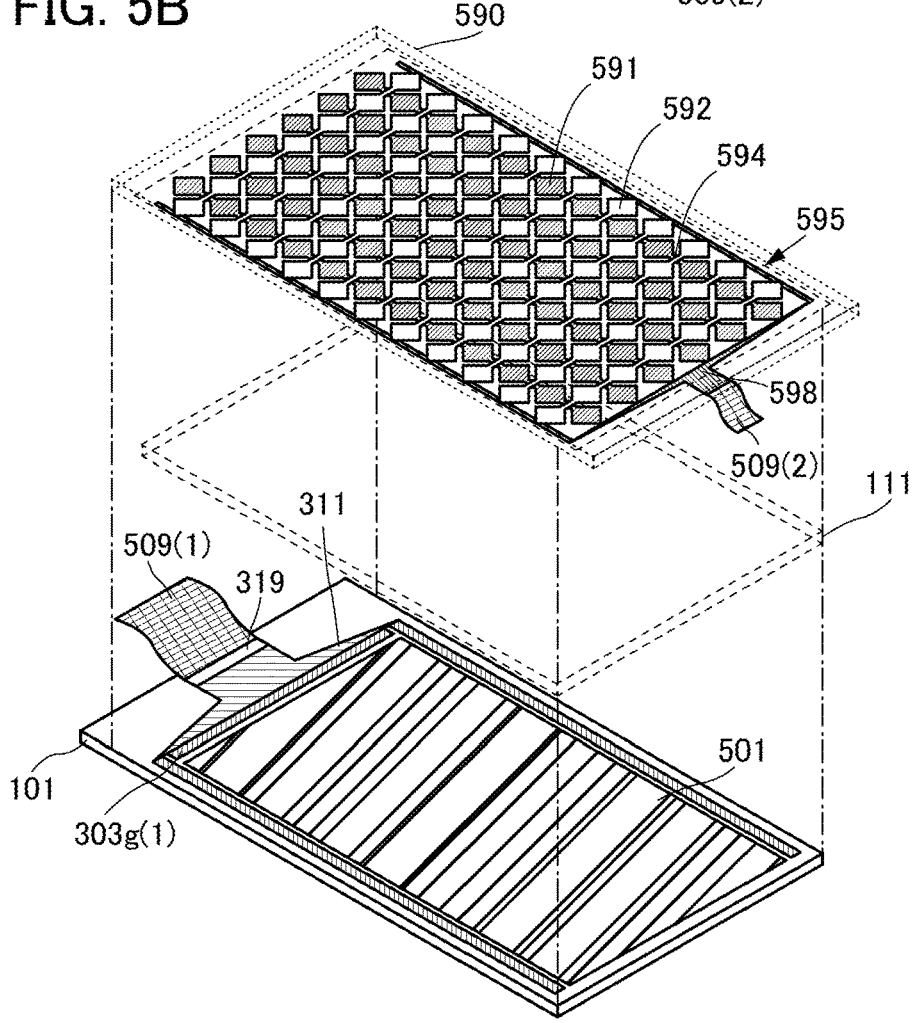
Figure 6A:
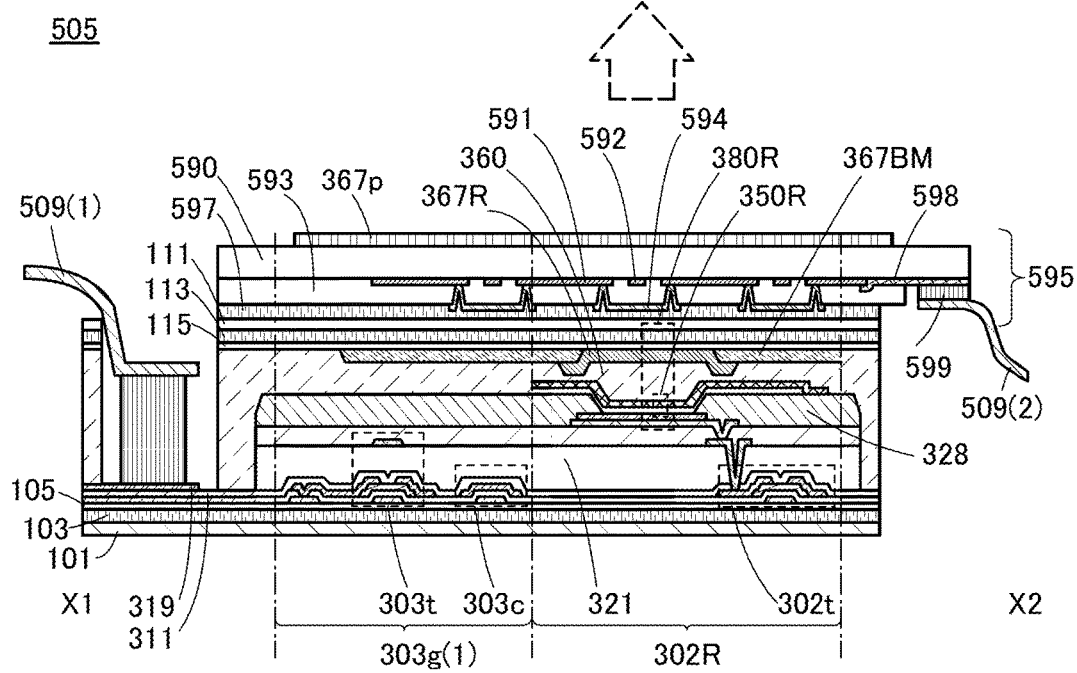
FIGS. 6A to 6C illustrate examples of an input/output device.
Figure 6B:
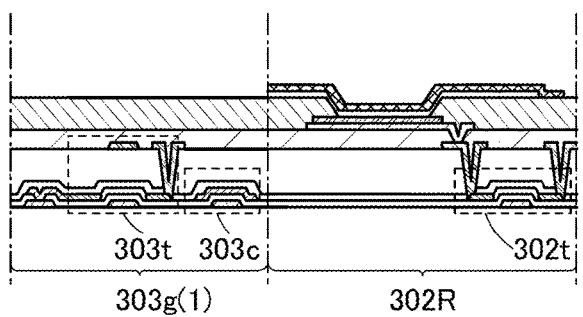
Figure 6C:
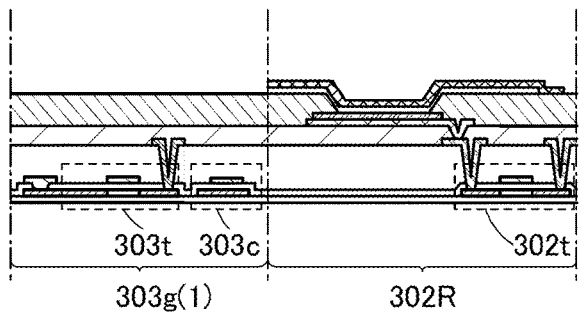

FIGS. 5A and 5B are perspective views of an input/output device 505. Note that FIGS. 5A and 5B illustrate only main components for simplicity. FIGS. 6A to 6C are each a cross-sectional view taken along the dashed-dotted line X1-X2 in FIG. 5A.

As illustrated in FIGS. 5A and 5B, the input/output device 505 includes a display portion 501, the scan line driver circuit 303g(1), a touch sensor 595, and the like. Furthermore, the input/output device 505 includes the substrate 101, the substrate 111, and a substrate 590.

Each of the substrate 111 and the substrate 590 is a substrate through which light from the light-emitting element is extracted. Accordingly, the substrate 111 preferably has higher average transmittance of light having a wavelength of greater than or equal to 400 nm and less than or equal to 800 nm than the substrate 101. Furthermore, the substrate 590 preferably has higher average transmittance of light having a wavelength of greater than or equal to 400 nm and less than or equal to 800 nm than the substrate 101.

The input/output device 505 includes a plurality of pixels and a plurality of wirings 311. The plurality of wirings 311 can supply signals to the pixels. The plurality of wirings 311 are led to a peripheral portion of the substrate 101, and part of the plurality of wirings 311 form the terminal 319. The terminal 319 is electrically connected to an FPC 509(1).

The input/output device 505 includes the touch sensor 595 and a plurality of wirings 598. The plurality of wirings 598 are electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 5B, electrodes, wirings, and the like of the touch sensor 595 provided on the back side of the substrate 590 (the side facing the substrate 101) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self capacitive touch sensor and a mutual capacitive touch sensor. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 5A and 5B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

A wiring 594 intersects with the electrode 592. The wiring 594 electrically connects two electrodes 591 between which one of the electrodes 592 is positioned. The intersecting area of the one of the electrodes 592 and the wiring 594 is preferably as small as possible. Such a structure allows a reduction in the area of a region where the electrodes are not provided, reducing unevenness in transmittance. As a result, unevenness in luminance of light transmitted through the touch sensor 595 can be reduced.

Note that the shapes of the electrodes 591 and the electrodes 592 are not limited to the above-mentioned shapes and can be any of a variety of shapes. For example, a plurality of first electrodes each having a stripe shape may be provided so that space between two adjacent first electrodes are reduced as much as possible, and a plurality of second electrodes each having a stripe shape may be provided so as to intersect with the first electrodes with an insulating layer sandwiched between the first electrodes and the second electrodes. In that case, two adjacent second electrodes may be spaced apart from each other. In that case, it is preferable to provide, between the two adjacent second electrodes, a dummy electrode which is electrically insulated from these electrodes, whereby the area of a region having a different transmittance can be reduced.

As illustrated in FIG. 6A, the input/output device 505 includes the substrate 101, the bonding layer 103, the insulating layer 105, the substrate 111, the bonding layer 113, and the insulating layer 115. The substrates 101 and 111 are attached to each other with the bonding layer 360.

A bonding layer 597 attaches the substrate 590 to the substrate 111 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The resistance of a material used for conductive films such as the electrodes 591, the electrodes 592, and the wiring 594, i.e., a wiring and an electrode in the touch panel, is preferably low. Examples of the material include ITO, indium zinc oxide, ZnO, silver, copper, aluminum, a carbon nanotube, and graphene. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, light transmittance of 89% or more and a sheet resistance of 40 ohm/square or more and 100 ohm/square or less can be achieved. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the input/output device can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure Example 1; thus, description is omitted.

Any of various kinds of transistors can be used in the input/output device. A structure in the case of using bottom-gate transistors is illustrated in FIGS. 6A and 6B.

For example, a semiconductor layer containing an oxide semiconductor, amorphous silicon, or the like can be used in the transistor 302t and the transistor 303t illustrated in FIG. 6A.

For example, a semiconductor layer containing polycrystalline silicon that is obtained by crystallization process such as laser annealing can be used in the transistor 302t and the transistor 303t illustrated in FIG. 6B.

A structure in the case of using top-gate transistors is illustrated in FIG. 6C.

For example, a semiconductor layer including polycrystalline silicon, a single crystal silicon film that is transferred from a single crystal silicon substrate, or the like can be used in the transistor 302t and the transistor 303t illustrated in FIG. 6C.

Structure Example 3

Figure 7A:
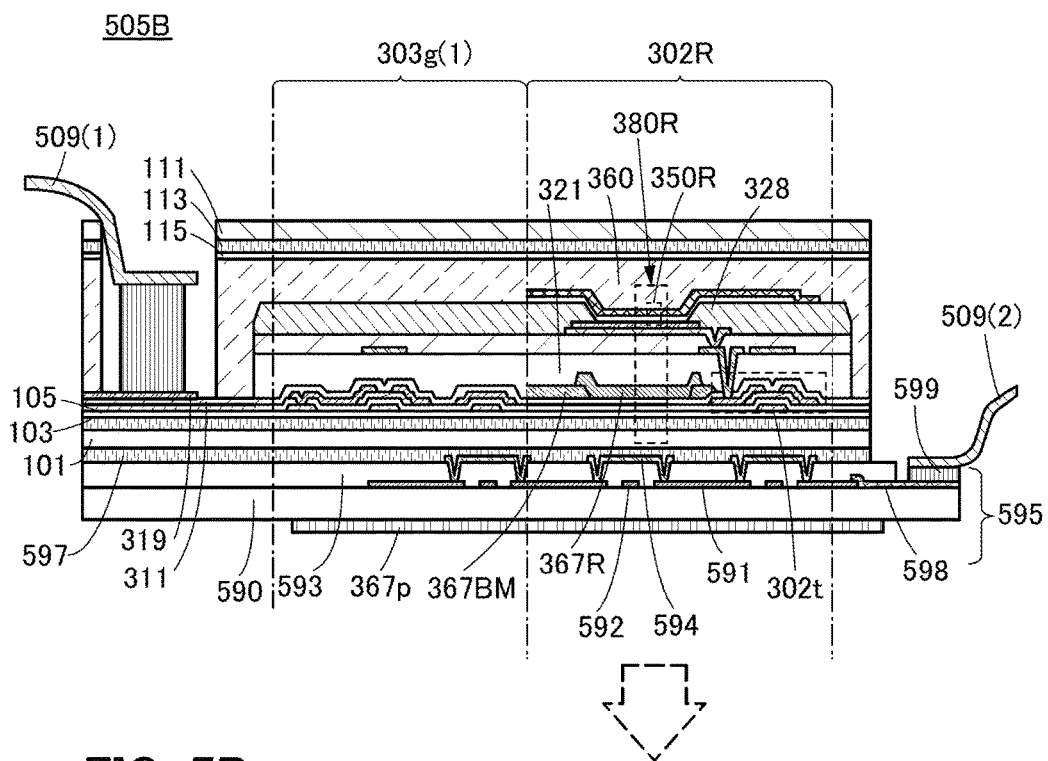
FIGS. 7A to 7C illustrate examples of an input/output device.
Figure 7B:
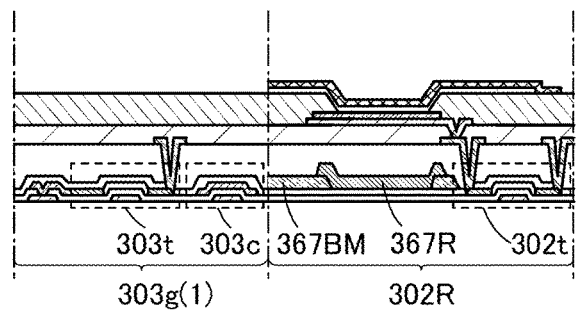
Figure 7C:
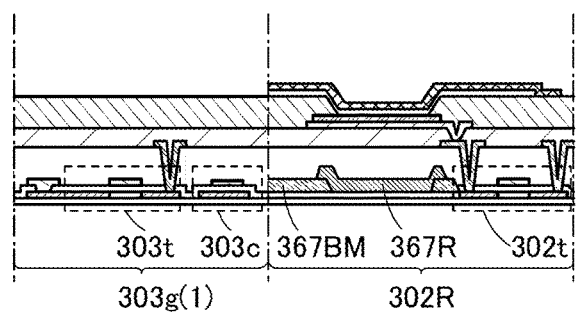

FIGS. 7A to 7C are cross-sectional views of an input/output device 505B. The input/output device 505B described in this embodiment is different from the input/output device 505 in Structure Example 2 in that received image data is displayed on the side where the transistors are provided and that the touch sensor is provided on the substrate 101 side of the display portion. Different structures will be described in detail below, and the above description is referred to for the other similar structures.

The coloring layer 367R is positioned in a region overlapping with the light-emitting element 350R. The light-emitting element 350R illustrated in FIG. 7A emits light to the side where the transistor 302t is provided. Accordingly, part of light emitted from the light-emitting element 350R passes through the coloring layer 367R and is emitted to the outside of the light-emitting module 380R as indicated by an arrow in FIG. 7A.

The input/output device 505B includes the light-blocking layer 367BM on the light extraction side. The light-blocking layer 367BM is provided so as to surround the coloring layer (e.g., the coloring layer 367R).

The touch sensor 595 is provided not on the substrate 111 side but on the substrate 101 side (see FIG. 7A).

Each of the substrate 101 and the substrate 590 is a substrate through which light from the light-emitting element is extracted. Accordingly, the substrate 101 preferably has higher average transmittance of light having a wavelength of greater than or equal to 400 nm and less than or equal to 800 nm than the substrate 111. Furthermore, the substrate 590 preferably has higher average transmittance of light having a wavelength of greater than or equal to 400 nm and less than or equal to 800 nm than the substrate 111.

The bonding layer 597 attaches the substrate 590 to the substrate 101 so that the touch sensor 595 overlaps with the display portion. The bonding layer 597 has a light-transmitting property.

Note that a structure in the case of using bottom-gate transistors in the display portion 501 is illustrated in FIGS. 7A and 7B.

For example, a semiconductor layer containing an oxide semiconductor, amorphous silicon, or the like can be used in the transistor 302t and the transistor 303t illustrated in FIG. 7A.

For example, a semiconductor layer containing polycrystalline silicon can be used in the transistor 302t and the transistor 303t illustrated in FIG. 7B.

A structure in the case of using top-gate transistors is illustrated in FIG. 7C.

For example, a semiconductor layer containing polycrystalline silicon, a single crystal silicon film that is transferred from a single crystal silicon substrate, or the like can be used in the transistor 302t and the transistor 303t illustrated in FIG. 7C.

Structure Example 4

Figure 9:
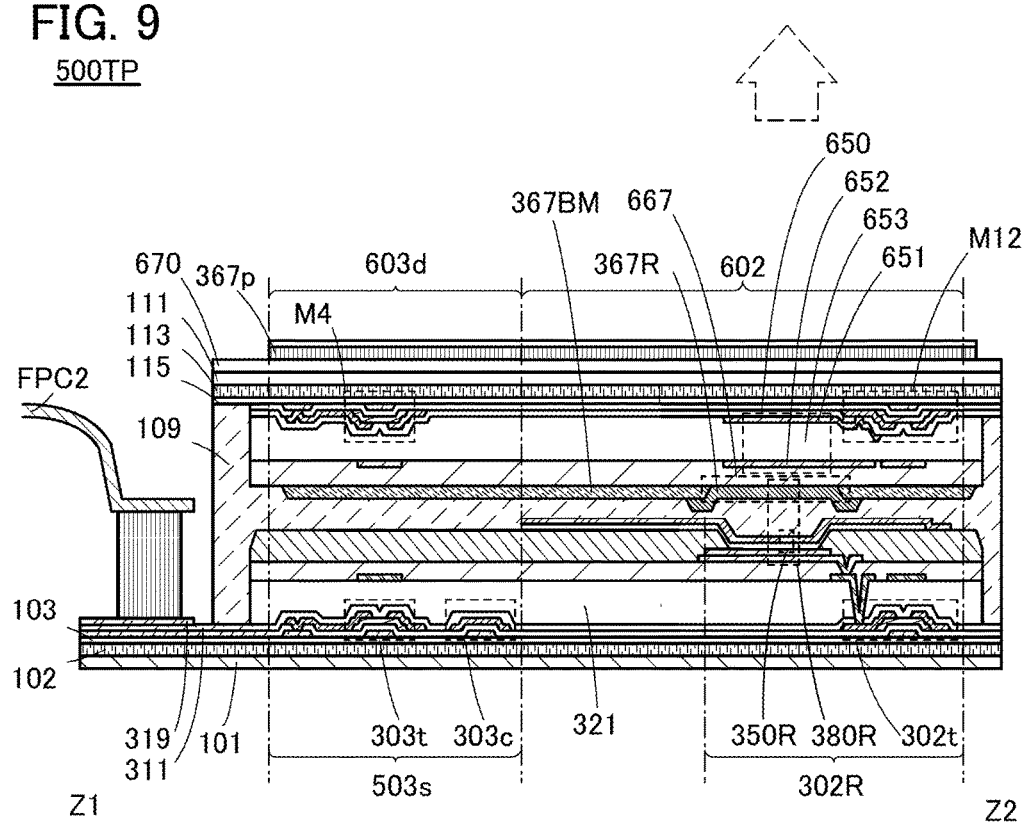
FIG. 9 illustrates an example of an input/output device.

As illustrated in FIG. 8, an input/output device 500TP includes a display portion 500 and an input portion 600 that overlap each other. FIG. 9 is a cross-sectional view taken along the dashed-dotted line Z1-Z2 in FIG. 8.

Individual components included in the input/output device 500TP are described below. Note that these components cannot be clearly distinguished and one component also serves as another component or include part of another component in some cases. Note that the input/output device 500TP in which the input portion 600 overlaps with the display portion 500 is also referred to as a touch panel.

The input portion 600 includes a plurality of sensing units 602 arranged in a matrix. The input portion 600 also includes a selection signal line G1, a control line RES, a signal line DL, and the like.

The selection signal line G1 and the control line RES are electrically connected to the plurality of sensing units 602 that are arranged in the row direction (indicated by the arrow R in FIG. 8). The signal line DL is electrically connected to the plurality of sensing units 602 that are arranged in the column direction (indicated by the arrow C in FIG. 8).

The sensing unit 602 senses an object that is close thereto or in contact therewith and supplies a sensing signal. For example, the sensing unit 602 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 602 senses, for example, a change in capacitance between the sensing unit 602 and an object close thereto or an object in contact therewith.

Note that when an object having a dielectric constant higher than that of the air, such as a finger, comes close to a conductive film in the air, the capacitance between the finger and the conductive film changes. The sensing unit 602 can sense the capacitance change and supply sensing data.

For example, the capacitance change causes charge distribution, leading to voltage change across the capacitor. This voltage change can be used as a sensing signal.

The sensing unit 602 is provided with a sensor circuit. The sensor circuit is electrically connected to the selection signal line G1, the control line RES, the signal line DL, or the like.

The sensor circuit includes a transistor, a sensor element, or the like. For example, a conductive film and a capacitor electrically connected to the conductive film can be used for the sensor circuit. A capacitor and a transistor electrically connected to the capacitor can also be used for the sensor circuit.

For example, a capacitor 650 including an insulating layer 653, and a first electrode 651 and a second electrode 652 between which the insulating layer 653 is provided can be used for the sensor circuit (see FIG. 9). The voltage between the electrodes of the capacitor 650 changes when an object comes close to the conductive film that is electrically connected to one electrode of the capacitor 650.

The sensing unit 602 includes a switch that can be turned on or off in accordance with a control signal. For example, a transistor M12 can be used as the switch.

A transistor which amplifies a sensing signal can be used in the sensor unit 602.

Transistors manufactured through the same process can be used as the transistor that amplifies a sensing signal and the switch. This allows the input portion 600 to be provided through a simplified process.

The sensing unit includes a plurality of window portions 667 arranged in a matrix. The window portion 667 transmits visible light, and a light-blocking layer 367BM may be provided between the plurality of window portions 667.

A coloring layer is provided in a position overlapping with the window portion 667 in the input/output device 500TP. The coloring layer transmits light of a predetermined color. Note that the coloring layer can be called a color filter. For example, a coloring layer 367B transmitting blue light, a coloring layer 367G transmitting green light, and a coloring layer 367R transmitting red light can be used. A coloring layer transmitting yellow light or a coloring layer transmitting white light may also be used.

The display portion 500 includes the plurality of pixels 302 arranged in a matrix. The pixel 302 is positioned so as to overlap with the window portions 667 of the input portion 600. The pixels 302 may be arranged at higher resolution than the sensing units 602. Each pixel has the same structure as Structure Example 1; thus, description is omitted.

The substrate 111 is a substrate through which light from the light-emitting element is extracted. Accordingly, the substrate 111 preferably has higher average transmittance of light having a wavelength of greater than or equal to 400 nm and less than or equal to 800 nm than the substrate 101.

The input/output device 500TP includes the input portion 600 that includes the plurality of sensing units 602 arranged in a matrix and the window portions 667 transmitting visible light, the display portion 500 that includes the plurality of pixels 302 overlapping with the window portions 667, and the coloring layers between the window portions 667 and the pixels 302. In addition, each sensing unit is provided with a switch with which interference in another sensing unit can be reduced.

With such a structure, sensing data sensed by each sensing unit can be supplied together with the positional data of the sensing unit. In addition, the sensing data associated with the positional data of the pixel for displaying an image can be supplied. Electrical continuity between a sensing unit that does not supply sensing data and the signal line is not established, whereby interference in a sensing unit that supplies a sensing signal can be reduced. Consequently, the novel input/output device 500TP that is highly convenient or highly reliable can be provided.

For example, the input portion 600 of the input/output device 500TP can sense sensing data and supply the sensing data together with the positional data. Specifically, a user of the input/output device 500TP can make a variety of gestures (e.g., tap, drag, swipe, and pinch-in operation) using, as a pointer, his/her finger or the like on the input portion 600.

The input portion 600 can sense a finger or the like that comes close to or is in contact with the input portion 600 and supply sensing data including a sensed position, path, or the like.

An arithmetic unit determines whether or not supplied data satisfies a predetermined condition on the basis of a program or the like and executes an instruction associated with a predetermined gesture.

Thus, a user of the input portion 600 can make the predetermined gesture with his/her finger or the like and make the arithmetic unit execute an instruction associated with the predetermined gesture.

For example, first, the input portion 600 of the input/output device 500TP selects one sensing unit X from the plurality of sensing units that can supply sensing data to one signal line. Then, electrical continuity between the signal line and the sensing units other than the sensing unit X is not established. This can reduce interference of the other sensing units in the sensing unit X.

Specifically, interference of sensing elements of the other sensing units in a sensing element of the sensing unit X can be reduced.

For example, in the case where a capacitor and a conductive film to which one electrode of the capacitor is electrically connected are used for the sensing element, interference of the potentials of the conductive films of the other sensing units in the potential of the conductive film of the sensing unit X can be reduced.

Thus, the input/output device 500TP can drive the sensing unit and supply sensing data independently of its size. The input/output device 500TP can have a variety of sizes, for example, ranging from a size for a hand-held device to a size for an electronic blackboard.

The input/output device 500TP can be folded and unfolded. Even in the case where interference of the other sensing units in the sensing unit X is different between the folded state and the unfolded state, the sensing unit can be driven and sensing data can be supplied without dependence on the state of the input/output device 500TP.

The display portion 500 of the input/output device 500TP can be supplied with display data. For example, an arithmetic unit can supply the display data.

In addition to the above structure, the input/output device 500TP can have the following structure.

The input/output device 500TP may include a driver circuit 603g or a driver circuit 603d. In addition, the input/output device 500TP (or driver circuit) may be electrically connected to an FPC1.

The driver circuit 603g can supply selection signals at predetermined timings, for example. Specifically, the driver circuit 603g supplies selection signals to the selection signal lines G1 row by row in a predetermined order. Any of a variety of circuits can be used as the driver circuit 603g. For example, a shift register, a flip-flop circuit, a combination circuit, or the like can be used.

The driver circuit 603d supplies sensing data on the basis of a sensing signal supplied from the sensing unit 602. Any of a variety of circuits can be used as the driver circuit 603d. For example, a circuit that can form a source follower circuit or a current mirror circuit by being electrically connected to the sensing circuit in the sensing unit can be used as the driver circuit 603d. In addition, an analog-to-digital converter circuit that converts a sensing signal into a digital signal may be provided in the driver circuit 603*d*.

The FPC1 supplies a timing signal, a power supply potential, or the like and is supplied with a sensing signal.

The input/output device 500TP may include a driver circuit 503*g*, a driver circuit 503*s*, a wiring 311, and a terminal 319. In addition, the input/output device 500TP (or driver circuit) may be electrically connected to an FPC2.

In addition, a protective layer 670 that prevents damage and protects the input/output device 500TP may be provided. For example, a ceramic coat layer or a hard coat layer can be used as the protective layer 670. Specifically, a layer containing aluminum oxide or an ultraviolet curable resin can be used.

In the case of a transflective liquid crystal display or a reflective liquid crystal display, some of or all of pixel electrodes function as reflective electrodes. For example, some or all of pixel electrodes are formed to contain aluminum or silver.

Furthermore, a memory circuit such as an SRAM can be provided under the reflective electrodes, leading to lower power consumption. A structure suitable for employed display elements can be selected from among a variety of structures of pixel circuits.

This embodiment can be combined with any other embodiment as appropriate.

Embodiment 3

In this embodiment, electronic devices and lighting devices of one embodiment of the present invention will be described with reference to drawings.

By applying one embodiment of the present invention, electronic devices and lighting devices can be made lightweight, thin, and flexible. For example, the light-emitting device (which includes the display device including a light-emitting element) described in Embodiment 1 and the input/output device described in Embodiment 2 can be used for a flexible display portion of an electronic device and a flexible light-emitting portion of a lighting device.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pachinko machines, and the like.

The electronic device or the lighting device of one embodiment of the present invention has flexibility and therefore can be incorporated along a curved inside/outside wall surface of a house or a building or a curved interior/exterior surface of a car.

The electronic device of one embodiment of the present invention may include a light-emitting device or an input/output device, and a secondary battery. In that case, it is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

An electronic device of one embodiment of the present invention may include a light-emitting device or an input/output device, an antenna, and a secondary battery. Receiving a signal with the antenna enables a display portion to display video, information, and the like. When the electronic device includes a secondary battery, the antenna may be used for non-contact power transmission.

Figure 10A:
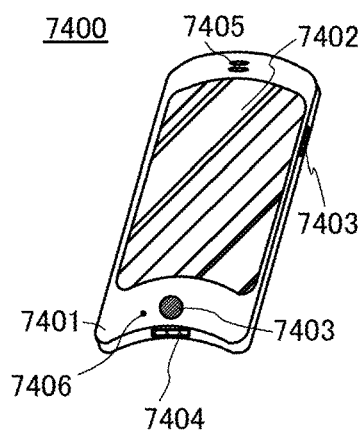
FIGS. 10A to 10K illustrate examples of electronic devices and lighting devices.

FIG. 10A illustrates an example of a cellular phone. A cellular phone 7400 includes a display portion 7402 incorporated in a housing 7401, an operation button 7403, an external connection port 7404, a speaker 7405, a microphone 7406, and the like. Note that the cellular phone 7400 is manufactured using the light-emitting device or input/output device of one embodiment of the present invention for the display portion 7402. One embodiment of the present invention makes it possible to provide a highly reliable cellular phone having a curved display portion with a high yield.

When the display portion 7402 of the cellular phone 7400 in FIG. 10A is touched with a finger or the like, data can be input into the cellular phone 7400. Moreover, operations such as making a call and inputting a letter can be performed by touch on the display portion 7402 with a finger or the like.

With the operation button 7403, power ON or OFF can be switched. In addition, a variety of images displayed on the display portion 7402 can be switched; switching a mail creation screen to a main menu screen, for example.

Figure 10B:
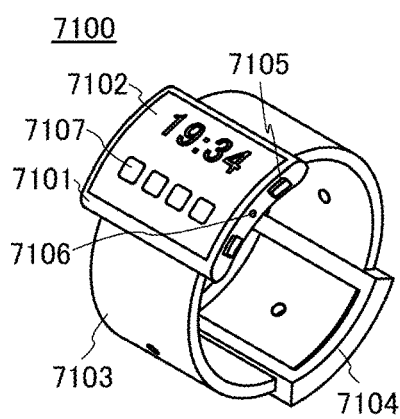

FIG. 10B is an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operating system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes the light-emitting device or input/output device of one embodiment of the present invention. One embodiment of the present invention makes it possible to provide a highly reliable portable information terminal having a curved display portion with a high yield.

Figure 10C:
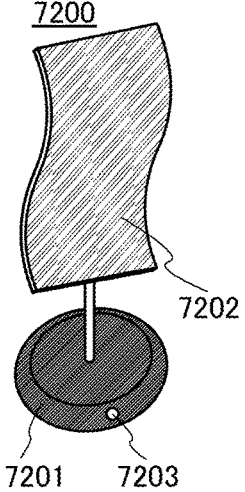
Figure 10D:
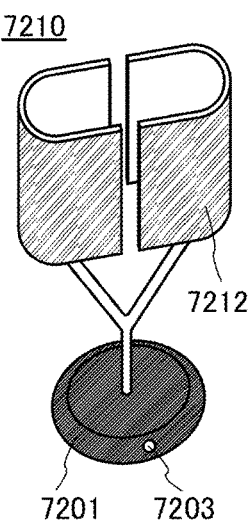
Figure 10E:
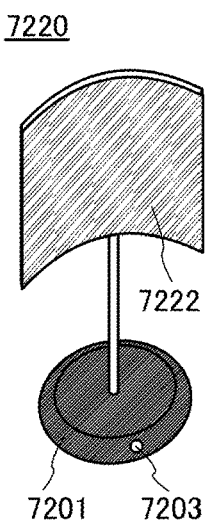

FIGS. 10C to 10E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 10C includes a light-emitting portion 7202 having a wave-shaped light-emitting surface, which is a good-design lighting device.

A light-emitting portion 7212 included in the lighting device 7210 in FIG. 10D has two convex-curved light-emitting portions symmetrically placed. Thus, all directions can be illuminated with the lighting device 7210 as a center.

The lighting device 7220 illustrated in FIG. 10E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface can be bent concavely so that a particular region is brightly illuminated, or bent convexly so that the whole room is brightly illuminated.

Here, each light-emitting portion includes the light-emitting device or input/output device of one embodiment of the present invention. One embodiment of the present invention makes it possible to provide a highly reliable lighting device having a curved light-emitting portion with a high yield.

Figure 10F:
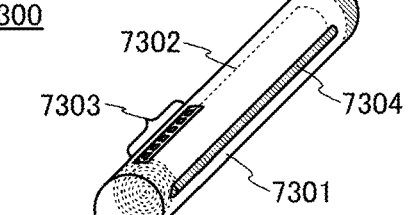

FIG. 10F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 10G:
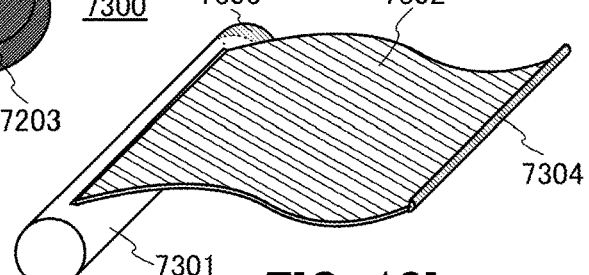
Figure 10H:
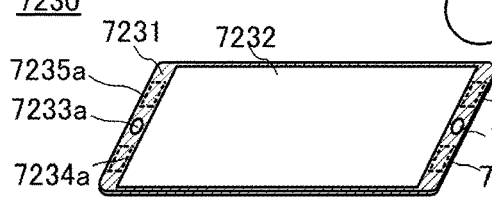
Figure 10I:
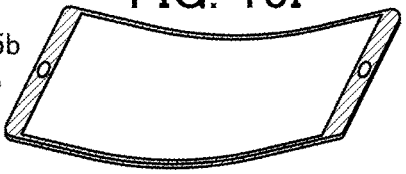
Figure 10J:
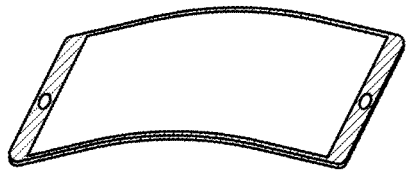

FIG. 10G illustrates the display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 10F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the light-emitting device or input/output device of one embodiment of the present invention. One embodiment of the present invention makes it possible to provide a lightweight and highly reliable display device with a high yield.

FIGS. 10H to 10K illustrate a flexible portable information terminal 7230. The portable information terminal 7230 includes a housing 7231 and a display portion 7232. In addition, the portable information terminal 7230 may include a button 7233a and a button 7233b which serve as input means, a speaker 7234a and a speaker 7234b which serve as sound output means, a vibration motor 7235a and a vibration motor 7235b which serve as vibration means, and the like.

The display portion 7232 includes the light-emitting device or input/output device of one embodiment of the present invention.

Figure 10K:

The display portion 7232 and the housing 7231 are flexible. Thus, it is easy to curve the portable information terminal 7230 into a desired shape or to twist the portable information terminal 7230. For example, the display portion 7232 can be concavely curved (FIG. 10I) or convexly curved (FIG. 10J) along a direction perpendicular to the long side of the portable information terminal 7230. Furthermore, the display portion 7232 can be curved along a direction parallel to the long side of the portable information terminal 7230 as illustrated in FIG. 10K.

FIGS. 11A to 11C illustrate a foldable portable information terminal 310. FIG. 11A illustrates the portable information terminal 310 that is opened. FIG. 11B illustrates the portable information terminal 310 that is being opened or being folded. FIG. 11C illustrates the portable information terminal 310 that is folded. The portable information terminal 310 is highly portable when folded. The portable information terminal 310 is highly browsable when opened because of its seamless large display region.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. The light-emitting device or input/output device of one embodiment of the present invention can be used for the display panel 312. For example, a light-emitting device or an input/output device that can be bent with a radius of curvature of greater than or equal to 0.01 mm and less than or equal to 150 mm can be used.

FIGS. 11D and 11E each illustrate a foldable portable information terminal 320. FIG. 11D illustrates the portable information terminal 320 that is folded so that a display portion 322 is on the outside. FIG. 11E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. The light-emitting device or input/output device of one embodiment of the present invention can be used for the display portion 322.

FIG. 11F is a perspective view illustrating an external shape of the portable information terminal 330. FIG. 11G is a top view of the portable information terminal 330. FIG. 11H is a perspective view illustrating an external shape of a portable information terminal 340.

The portable information terminals 330 and 340 each function as, for example, one or more of a telephone set, a notebook, an information browsing system, and the like.

Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 11F and 11H). In addition, information 337 indicated by dashed rectangles can be displayed on another surface (FIGS. 11G and 11H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 11F and 11G illustrate an example in which the information 337 is displayed at the top, one embodiment of the present invention is not limited thereto. For example, the information 337 may be displayed on the side as in the portable information terminal 340 in FIG. 11H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

The light-emitting device or input/output device of one embodiment of the present invention can be used for a display portion 333 mounted in each of a housing 335 of the portable information terminal 330 and a housing 336 of the portable information terminal 340. One embodiment of the present invention makes it possible to provide a highly reliable portable information terminal having a curved display portion with a high yield.

As in a portable information terminal 345 illustrated in FIG. 11I, data may be displayed on three or more surfaces. Here, data 355, data 356, and data 357 are displayed on different surfaces.

For a display portion 358 included in a housing 351 of the portable information terminal 345, the light-emitting device or input/output device of one embodiment of the present invention can be used. One embodiment of the present invention makes it possible to provide a highly reliable portable information terminal having a curved display portion with a high yield.

This embodiment can be combined with any other embodiment as appropriate.

This application is based on Japanese Patent Application serial no. 2014-133819 filed with Japan Patent Office on Jun. 30, 2014, the entire contents of which are hereby incorporated by reference.

What is claimed is:

1. A light-emitting device comprising:
a first flexible substrate comprising a first organic resin material;
a first bonding layer over the first flexible substrate;
an element layer comprising a light-emitting element over the first bonding layer;
a second bonding layer over the element layer; and
a second flexible substrate comprising a second organic resin material over the second bonding layer,
wherein an opening is provided in the element layer, the second bonding layer, and the second flexible substrate,
wherein the light-emitting element is configured to emit light on the second flexible substrate side,
wherein the second flexible substrate has higher average transmittance of light having a wavelength of greater than or equal to 400 nm and less than or equal to 800 nm than the first flexible substrate,
wherein the first flexible substrate is yellower than the second flexible substrate, and
wherein the first organic resin material comprises aramid.

2. The light-emitting device according to claim 1,
wherein a difference in coefficient of linear expansion between the first flexible substrate and the second flexible substrate is 15 ppm/K or less.

3. The light-emitting device according to claim 1,
wherein a difference in thickness between the first flexible substrate and the second flexible substrate is 10 µm or less.

4. The light-emitting device according to claim 1,
wherein a difference between a first total thickness of the first flexible substrate and the first bonding layer and a second total thickness of the second flexible substrate and the second bonding layer is 10 µm or less.

5. The light-emitting device according to claim 1,
wherein a difference in thickness between the first bonding layer and the second bonding layer is 10 µm or less.

6. The light-emitting device according to claim 1,
wherein a first glass transition temperature of the first flexible substrate is higher than a second glass transition temperature of the second flexible substrate.

7. The light-emitting device according to claim 1,
wherein the each of the first bonding layer and the second bonding layer is an adhesive including an organic material.

8. The light-emitting device according to claim 1,
wherein the each of the first bonding layer and the second bonding layer is an epoxy resin, an acrylic resin, a silicone resin, a phenol resin, a polyimide resin, an imide resin, a polyvinyl chloride resin, a polyvinyl butyral resin, or an ethylene vinyl acetate resin.

9. The light-emitting device according to claim 1,
wherein a connector connected to an FPC is connected to a conductive layer over the first flexible substrate through the opening.

10. The light-emitting device according to claim 1,
wherein the second organic resin material comprises polyethylene naphthalate.

11. The light-emitting device according to claim 1,
wherein the first flexible substrate has higher reflectance of light having a wavelength of greater than or equal to 570 nm and less than or equal to 590 nm than the second flexible substrate.

12. A module comprising the light-emitting device according to claim 1 and an FPC.

13. An electronic device comprising:
the light-emitting device according to claim 1; and
at least one of an antenna, a battery, a housing, a speaker, a microphone, an operation switch, and an operation button.

14. A light-emitting device comprising:
a first flexible substrate comprising a first organic resin material;
a first bonding layer over the first flexible substrate;
an element layer comprising a light-emitting element over the first bonding layer;
a second bonding layer over the element layer; and
a second flexible substrate comprising a second organic resin material over the second bonding layer, wherein the light-emitting element is configured to emit light on the second flexible substrate side, wherein the first flexible substrate is yellower than the second flexible substrate, and wherein the first organic resin material comprises aramid.

15. The light-emitting device according to claim 14, wherein a difference in coefficient of linear expansion between the first flexible substrate and the second flexible substrate is 15 ppm/K or less.

16. The light-emitting device according to claim 14, wherein a difference in thickness between the first flexible substrate and the second flexible substrate is 10 µm or less.

17. The light-emitting device according to claim 14, wherein a difference between a first total thickness of the first flexible substrate and the first bonding layer and a second total thickness of the second flexible substrate and the second bonding layer is 10 µm or less.

18. The light-emitting device according to claim 14, wherein a difference in thickness between the first bonding layer and the second bonding layer is 10 µm or less.

19. The light-emitting device according to claim 14, wherein a first glass transition temperature of the first flexible substrate is higher than a second glass transition temperature of the second flexible substrate.

20. The light-emitting device according to claim 14, wherein the each of the first bonding layer and the second bonding layer is an adhesive including an organic material.

21. The light-emitting device according to claim 14, wherein the each of the first bonding layer and the second bonding layer is an epoxy resin, an acrylic resin, a silicone resin, a phenol resin, a polyimide resin, an imide resin, a polyvinyl chloride resin, a polyvinyl butyral resin, or an ethylene vinyl acetate resin.

22. A module comprising the light-emitting device according to claim 14 and an FPC.

23. An electronic device comprising:
the light-emitting device according to claim 14; and
at least one of an antenna, a battery, a housing, a speaker, a microphone, an operation switch, and an operation button.

24. A light-emitting device comprising:
a first flexible substrate comprising a first organic resin material;
an element layer comprising a light-emitting element over the first flexible substrate; and
a second flexible substrate comprising a second organic resin material over the element layer,
wherein the light-emitting element is configured to emit light on the second flexible substrate side,
wherein the first flexible substrate is yellower than the second flexible substrate,
wherein the first organic resin material comprises aramid,
wherein the second organic resin material is different from the first organic resin material, and
wherein a difference in thickness between the first flexible substrate and the second flexible substrate is 10 µm or less.

25. The light-emitting device according to claim 24, wherein a difference in coefficient of linear expansion between the first flexible substrate and the second flexible substrate is 15 ppm/K or less.

26. The light-emitting device according to claim 24, wherein a first glass transition temperature of the first flexible substrate is higher than a second glass transition temperature of the second flexible substrate.

27. A module comprising the light-emitting device according to claim 24 and an FPC.

28. An electronic device comprising:
the light-emitting device according to claim 24; and
at least one of an antenna, a battery, a housing, a speaker, a microphone, an operation switch, and an operation button.

* * * * *